US012764953B2

(12) United States Patent
Park et al.

(10) Patent No.: US 12,764,953 B2
(45) Date of Patent: Oct. 13, 2026

(54) SEMICONDUCTOR MEMORY DEVICES, ELECTRONIC SYSTEMS INCLUDING THE SAME AND FABRICATING METHODS OF THE SAME

(71) Applicant: Samsung Electronics Co., Ltd., Suwon-si (KR)

(72) Inventors: Jin Young Park, Suwon-si (KR); Hyuk Kim, Seongnam-si (KR); Yeon Geun Yook, Seongnam-si (KR); Young Sik Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 959 days.

(21) Appl. No.: 17/819,330

(22) Filed: Aug. 12, 2022

(65) Prior Publication Data

US 2023/0147901 A1 May 11, 2023

(30) Foreign Application Priority Data

Nov. 11, 2021 (KR) ........................ 10-2021-0154857

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 43/27; H10B 41/10; H10B 41/27; H10B 41/35; H10B 41/40; H10B 43/10;
(Continued)

(56) References Cited

U.S. PATENT DOCUMENTS 8,828,884 B2 9/2014 Lee et al.
9,627,469 B2 4/2017 Yi et al.
(Continued)

FOREIGN PATENT DOCUMENTS

KR 10-2020-0038321 A 4/2020
KR 10-2020-0055186 A 5/2020
KR 10-2021-0025032 A 3/2021

*Primary Examiner* — Fernando L Toledo
*Assistant Examiner* — Jahae Kim
(74) *Attorney, Agent, or Firm* — Wolf, Greenfield & Sacks, P.C.

(57) ABSTRACT

Semiconductor memory devices may include a cell substrate including a cell array region, first and second extension regions and a through region, a first mold structure including first gate electrodes stacked in a stepwise manner, a first interlayer insulating layer extending conformally on the first gate electrodes on the second extension region, a second interlayer insulating layer on the first interlayer insulating layer, a second mold structure including second gate electrodes on the second interlayer insulating layer and stacked on the first extension region in the stepwise manner, a channel structure in the first and second mold structures on the cell array region, a first cell contact structure in the first mold structure on the second extension region, and a second cell contact structure in the first and second mold structures on the first extension region. The first and second interlayer insulating layers may have different impurity concentrations.

18 Claims, 30 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/35*** | (2023.01) |
| ***H10B 43/40*** | (2023.01) |
| ***H10W 20/41*** | (2026.01) |
| ***H10W 20/42*** | (2026.01) |

(52) U.S. Cl.
CPC ............. *H10B 41/40* (2023.02); *H10B 43/10* (2023.02); *H10B 43/35* (2023.02); *H10B 43/40* (2023.02); *H10W 20/42* (2026.01); *H10W 20/435* (2026.01)

(58) Field of Classification Search
CPC ..... H10B 43/35; H10B 43/40; H01L 23/5226; H01L 23/5283; H10W 20/42; H10W 20/435
See application file for complete search history.

(56) References Cited

U.S. PATENT DOCUMENTS

| | | | | |
|---|---|---|---|---|
| 9,780,113 | B2 | 10/2017 | Im et al. | |
| 10,199,388 | B2 | 2/2019 | Tsiang et al. | |
| 10,672,711 | B2 | 6/2020 | Zhu et al. | |
| 2002/0113239 | A1* | 8/2002 | Uochi ................ | H10D 30/0314 438/149 |
| 2019/0252396 | A1* | 8/2019 | Mushiga ................ | H10B 41/27 |
| 2019/0280003 | A1* | 9/2019 | Mushiga ................ | H10B 41/27 |
| 2021/0082941 | A1 | 3/2021 | Son et al. | |
| 2021/0098367 | A1 | 4/2021 | Lee | |
| 2022/0223524 | A1* | 7/2022 | Choi ...................... | H10B 41/10 |

* cited by examiner

SEMICONDUCTOR MEMORY DEVICES, ELECTRONIC SYSTEMS INCLUDING THE SAME AND FABRICATING METHODS OF THE SAME

CROSS-REFERENCE TO RELATED APPLICATION

This application claims priority to Korean Patent Application No. 10-2021-0154857 filed on Nov. 11, 2021, in the Korean Intellectual Property Office, and all the benefits accruing therefrom under 35 U.S.C. 119, the contents of which in its entirety are herein incorporated by reference.

BACKGROUND

The present disclosure relates to a semiconductor memory device, an electronic system including the same, and a fabricating method of the same, and more particularly, to a semiconductor memory device including a multi-stack, an electronic system including the same, and a fabricating method of the same.

In order to satisfy high performance and low price demanded by consumers, a degree of integration of semiconductor memory devices has increased. Since the degree of integration of the semiconductor memory devices is one of various factors determining the price of the product, the increased degree of integration may be desirable.

Meanwhile, since the degree of integration of two-dimensional (2D) or planar semiconductor memory devices is mainly determined by an area occupied by a unit memory cell, it is greatly affected by the level of technology for forming a fine pattern. However, expensive equipment may be used for pattern miniaturization, and thus the degree of integration of the 2D semiconductor devices is increasing, but is still limited. Accordingly, three-dimensional semiconductor devices including memory cells arranged three-dimensionally have been proposed.

SUMMARY

Aspects of the present invention provide a semiconductor memory device capable of having improved reliability.

Aspects of the present invention provide an electronic system capable of having improved reliability.

Aspects of the present invention provide fabricating method of a semiconductor memory device.

However, aspects of the present invention are not restricted to those set forth herein. The above and other aspects of the present invention will become more apparent to one of ordinary skill in the art to which the present disclosure pertains by referencing the detailed description of the present disclosure given below.

According to some embodiments of the present invention, there is provided a semiconductor memory device comprising a cell substrate including a cell array region, a first extension region, a second extension region, and a through region, a first mold structure including a plurality of first gate electrodes sequentially stacked on the cell substrate and stacked on the second extension region in a stepwise manner, a first interlayer insulating layer extending conformally on the first gate electrodes on the second extension region, a second interlayer insulating layer on the first interlayer insulating layer, a second mold structure including a plurality of second gate electrodes sequentially stacked on the second interlayer insulating layer and stacked on the first extension region in the stepwise manner, a third interlayer insulating layer on the second gate electrodes, a channel structure in (e.g., penetrating through) the first mold structure and the second mold structure on the cell array region, a first cell contact structure in (e.g., penetrating through) the first mold structure on the second extension region, and a second cell contact structure in (e.g., penetrating through) the first mold structure and the second mold structure on the first extension region, wherein an impurity concentration of the first interlayer insulating layer is different from an impurity concentration of the second interlayer insulating layer.

According to some embodiments of the present invention, there is provided a semiconductor memory device comprising a cell substrate including a cell array region, a first extension region, a second extension region, a third extension region, and a through region, a first mold structure including a plurality of first gate electrodes sequentially stacked on the cell substrate and stacked on the third extension region in a stepwise manner, a first interlayer insulating layer extending conformally on the first gate electrodes on the third extension region, a second mold structure including a plurality of second gate electrodes sequentially stacked on the first interlayer insulating layer and stacked on the second extension region in the stepwise manner, a second interlayer insulating layer extending conformally on the second gate electrodes on the second extension region, a third mold structure including a plurality of third gate electrodes sequentially stacked on the second interlayer insulating layer and stacked on the first extension region in the stepwise manner, a third interlayer insulating layer conformally disposed on the third gate electrodes in the first extension region, a channel structure in (e.g., penetrating through) the first to third mold structures on the cell array region, a first cell contact structure in (e.g., penetrating through) the first mold structure on the third extension region, a second cell contact structure in (e.g., penetrating through) the first mold structure and the second mold structure on the second extension region, and a third cell contact structure in (e.g., penetrating through) the first to third mold structures on the first extension region, wherein an impurity concentration of the first interlayer insulating layer is different from each of an impurity concentration of the second interlayer insulating layer and an impurity concentration of the third interlayer insulating layer.

According to some embodiments of the present invention, there is provided an electronic system comprising a main board, a semiconductor memory device on the main board, and a controller electrically connected to the semiconductor memory device on the main board, wherein the semiconductor memory device includes a cell substrate including a cell array region, a first extension region, a second extension region, and a through region, a first mold structure including a plurality of first gate electrodes sequentially stacked on the cell substrate and stacked on the second extension region in a stepwise manner, a first interlayer insulating layer extending conformally on the first gate electrodes on the second extension region, a second interlayer insulating layer on the first interlayer insulating layer, a second mold structure including a plurality of second gate electrodes sequentially stacked on the second interlayer insulating layer and stacked on the first extension region in the stepwise manner, a third interlayer insulating layer on the second gate electrodes, a channel structure in (e.g., penetrating through) the first mold structure and the second mold structure in the cell array region, a first cell contact structure in (e.g., penetrating through) the first mold structure in the second extension region, and a second cell contact structure in (e.g., penetrating through) the first mold structure and the second mold structure on the first extension region, wherein an impurity concentration of the first interlayer insulating layer is different from an impurity concentration of the second interlayer insulating layer According to some embodiments of the present invention, there is provided a fabricating method of a semiconductor memory device, the fabricating method comprising providing a cell substrate including a cell array region, a first extension region, a second extension region, and a through region, forming a first mold structure including a plurality of first gate electrodes sequentially stacked on the cell substrate, each of the first gate electrodes including a step-shaped first pad region in which a portion of a top surface thereof is exposed on the second extension region, forming a first interlayer insulating layer on the first gate electrodes on the second extension region, forming a second interlayer insulating layer on the first interlayer insulating layer on the second extension region, simultaneously forming a plurality of first vias in (e.g., penetrating through) the first and second interlayer insulating layers and the first mold structure by performing etching on the first extension region and the second extension region forming first preliminary structures in the plurality of first vias, respectively, forming a second mold structure including a plurality of second gate electrodes sequentially stacked on the second interlayer insulating layer, each of the second gate electrodes including a step-shaped second pad region in which a portion of a top surface thereof is exposed on the first extension region, forming a third interlayer insulating layer on the second gate electrodes on the first extension region, simultaneously forming a plurality of second vias in (e.g., penetrating through) the third interlayer insulating layer and the second mold structure by performing etching on the first extension region and the second extension region, forming second preliminary structures in the plurality of second vias, respectively, the second preliminary structures being connected to the first preliminary structures, respectively, forming a plurality of holes by removing the first and second preliminary structures, and forming a plurality of metal vias in the plurality of holes, respectively, wherein an impurity concentration of the first interlayer insulating layer is different from an impurity concentration of the second interlayer insulating layer

BRIEF DESCRIPTION OF DRAWINGS

The above and other aspects and features of the present invention will become more apparent by describing in detail some embodiments thereof with reference to the attached drawings, in which.

DETAILED DESCRIPTION

Hereinafter, a semiconductor memory device according to some embodiments will be described with reference to FIGS. 1 to 14.

Figure 1:
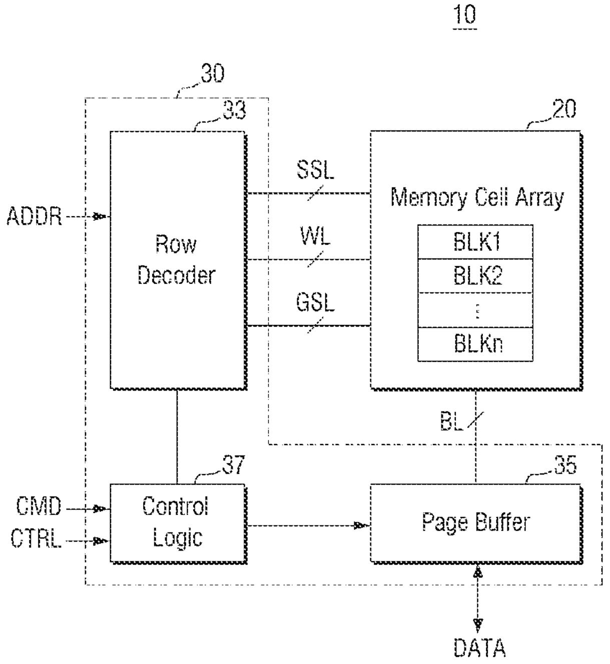
FIG. 1 is a block diagram illustrating a semiconductor memory device according to some embodiments of the present invention.

FIG. 1 is a block diagram illustrating a semiconductor memory device according to some embodiments of the present invention.

Referring to FIG. 1, a semiconductor memory device 10 according to some embodiments of the present invention may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string select line SSL, and at least one ground select line GSL. Specifically, the memory cell blocks BLK1 to BLKn may be connected to a row decoder 33 through the word line WL, the string select line SSL, and the ground select line GSL. In addition, the memory cell blocks BLK1 to BLKn may be connected to a page buffer 35 through the bit line BL.

The peripheral circuit 30 may receive an address ADDR, a command CMD, and a control signal CTRL from the outside of the semiconductor memory device 10, and may transmit and receive data DATA to and from an external device of the semiconductor memory device 10. The peripheral circuit 30 may include a control logic 37, a row decoder 33, and a page buffer 35. Although not illustrated, the peripheral circuit 30 may further include various sub-circuits such as an input/output circuit, a voltage generating circuit for generating various voltages necessary for an operation of the semiconductor memory device 10, and an error correction circuit for correcting an error in data DATA read from the memory cell array 20.

The control logic 37 may be connected to the row decoder 33, the input/output circuit, and the voltage generating circuit. The control logic 37 may control an overall operation of the semiconductor memory device 10. The control logic 37 may generate various internal control signals used in the semiconductor memory device 10 in response to a control signal CTRL. For example, the control logic 37 may adjust a voltage level provided to the word line WL and the bit line BL when a memory operation such as a program operation or an erase operation is performed.

The row decoder 33 may select at least one of the plurality of memory cell blocks BLK1 to BLKn in response to the address ADDR, and may select at least one word line WL, at least one string select line SSL, and at least one ground select line GSL of the selected memory cell blocks BLK1 to BLKn. In addition, the row decoder 33 may transfer a voltage for performing a memory operation to the word line WL of the selected memory cell blocks BLK1 to BLKn.

The page buffer 35 may be connected to the memory cell array 20 through the bit line BL. The page buffer 35 may operate as a write driver or a sense amplifier. Specifically, when performing a program operation, the page buffer 35 operates as the write driver to apply a voltage according to the data DATA to be stored in the memory cell array 20 to the bit line BL. Meanwhile, when performing a read operation, the page buffer 35 may operate as the sense amplifier to sense the data DATA stored in the memory cell array 20.

Figure 2:
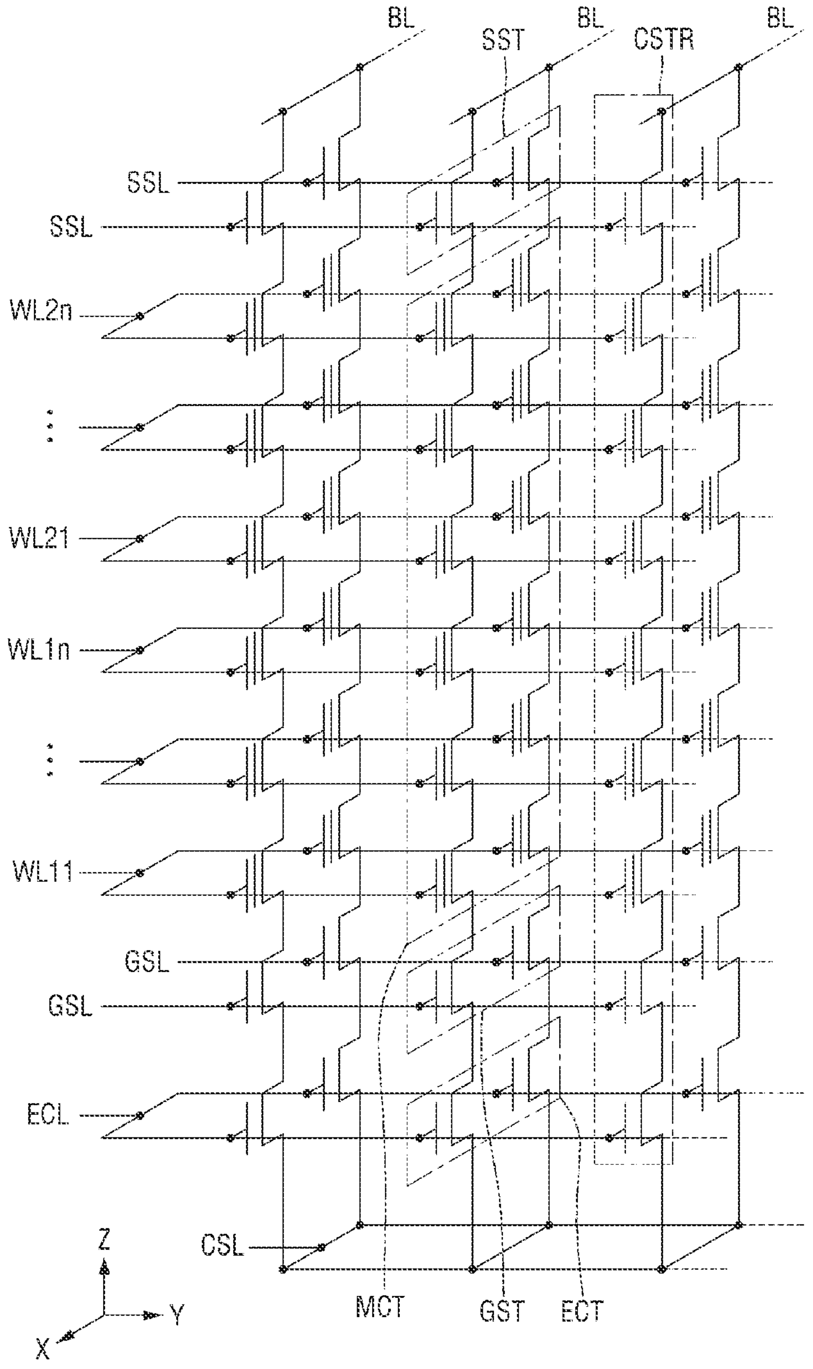
FIG. 2 is a circuit diagram illustrating a semiconductor memory device according to some embodiments of the present invention.

FIG. 2 is a circuit diagram illustrating a semiconductor memory device according to some embodiments of the present invention.

Referring to FIG. 2, the memory cell array (e.g., 20 of FIG. 1) of the semiconductor memory device according to some embodiments of the present invention may include a common source line CSL, a plurality of bit lines BL, and a plurality of cell strings CSTR.

The common source line CSL may extend in a first direction X. In some embodiments, the plurality of common source lines CSL may be two-dimensionally arranged. For example, the plurality of common source lines CSL may be spaced apart from each other and extend in the first direction X, respectively. The common source lines CSL may be electrically applied with the same voltage, or may be applied with different voltages to be separately controlled.

The plurality of bit lines BL may be two-dimensionally arranged. For example, the bit lines BL may be spaced apart from each other and extend in a second direction Y crossing the first direction X. A plurality of cell strings CSTR may be connected in parallel to each of the bit lines BL. The cell strings CSTR may be commonly connected to a common source line CSL. That is, the plurality of cell strings CSTR may be disposed between the bit lines BL and the common source line CSL.

Each of the cell strings CSTR may include a ground select transistor GST connected to the common source line CSL, a string select transistor SST connected to the bit line BL, and a plurality of memory cell transistors MCT disposed between the ground select transistor GST and the string select transistor SST. Each of the memory cell transistors MCT may include a data storage element. The ground select transistor GST, the string select transistor SST, and the memory cell transistors MCT may be connected in series.

The common source line CSL may be commonly connected to sources of the ground select transistors GST. In addition, the ground select line GSL, a plurality of word lines WL11 to WL1$n$ and WL21 to WL2$n$, and the string select line SSL may be disposed between the common source line CSL and the bit line BL. The ground select line GSL may be used as a gate electrode of the ground select transistor GST, the word lines WL11 to WL1$n$ and WL21 to WL2$n$ may be used as gate electrodes of the memory cell transistors MCT, and the string select line SSL may be used as a gate electrode of the string select transistor SST.

In some embodiments, an erase control transistor ECT may be disposed between the common source line CSL and the ground select transistor GST. The common source line CSL may be commonly connected to sources of the erase control transistors ECT. In addition, an erase control line ECL may be disposed between the common source line CSL and the ground select line GSL. The erase control line ECL may be used as a gate electrode of the erase control transistor ECT. The erase control transistors ECT may generate a gate induced drain leakage (GIDL) to perform an erase operation of the memory cell array.

Figure 3:
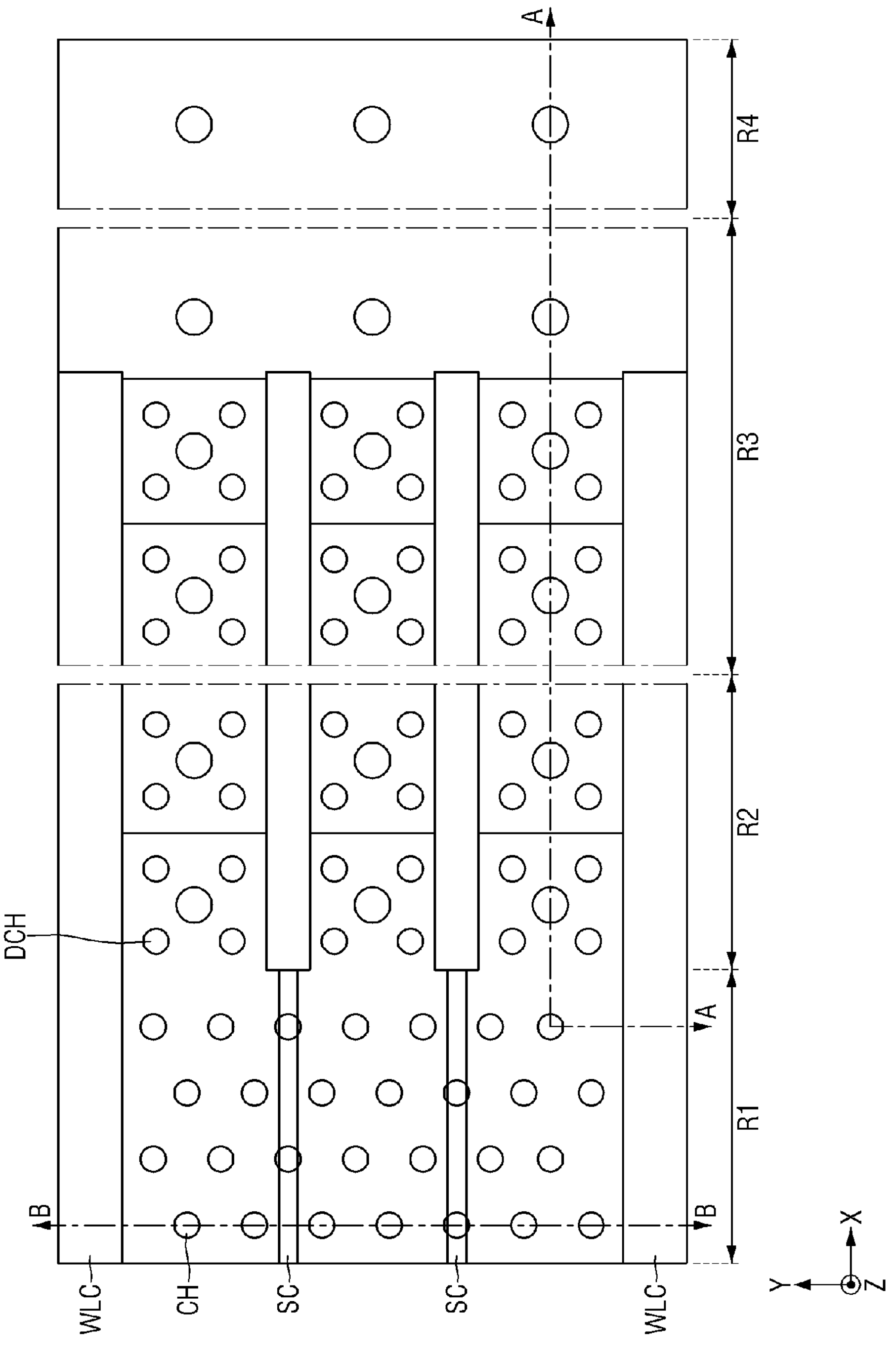
FIG. 3 is a layout diagram illustrating a semiconductor memory device according to some embodiments of the present invention.
Figure 4:
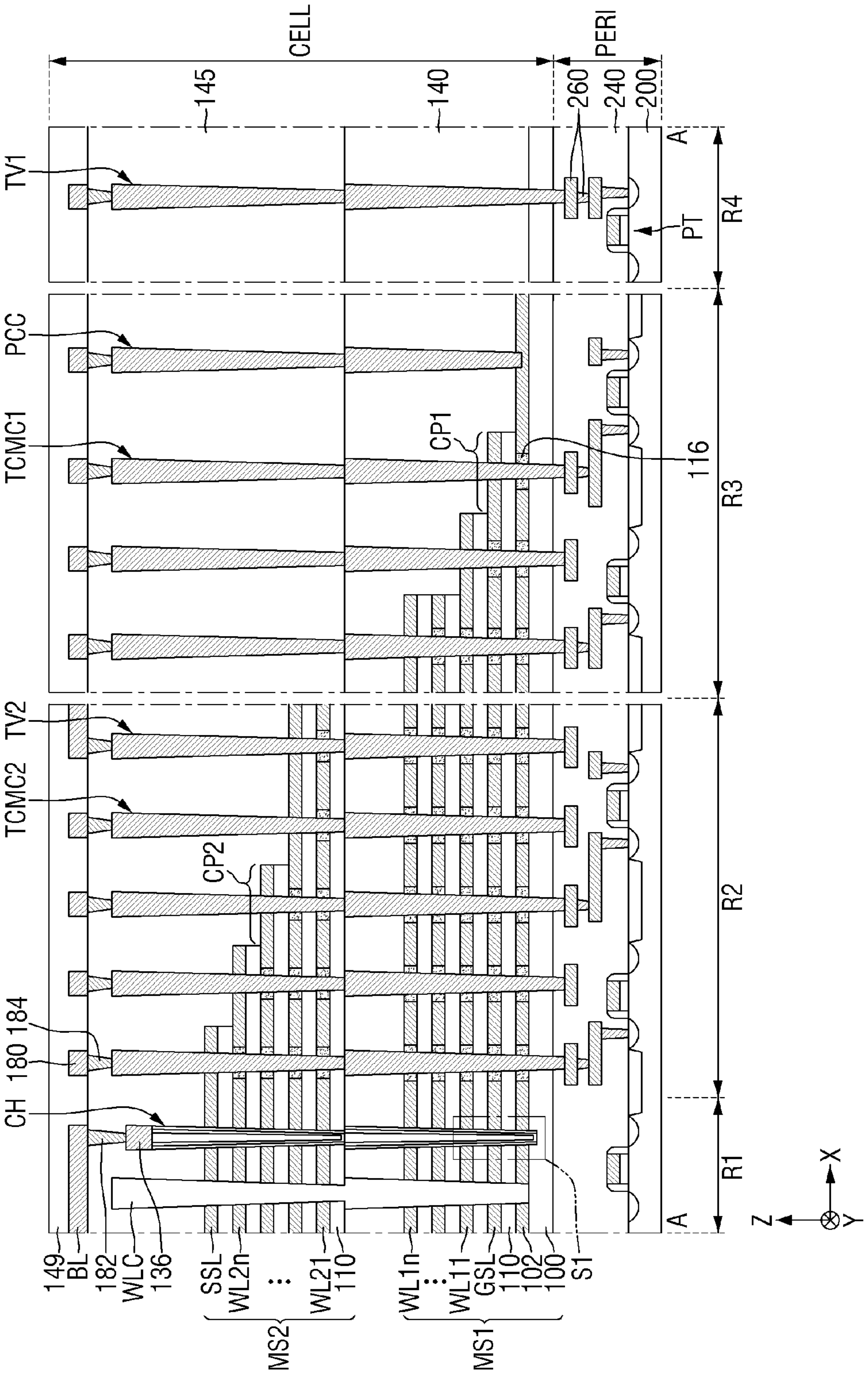
FIG. 4 is a cross-sectional view taken along line A-A of FIG. 3.
Figure 5:
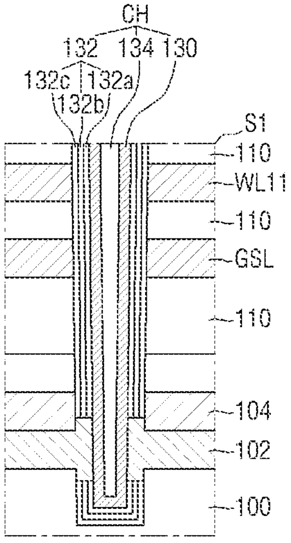
FIGS. 5 and 6 are enlarged cross-sectional views illustrating a region S1 of FIG. 4.
Figure 6:
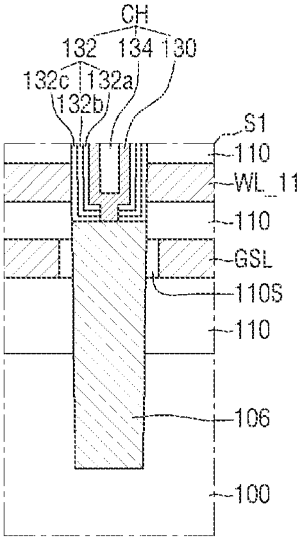
Figure 7:
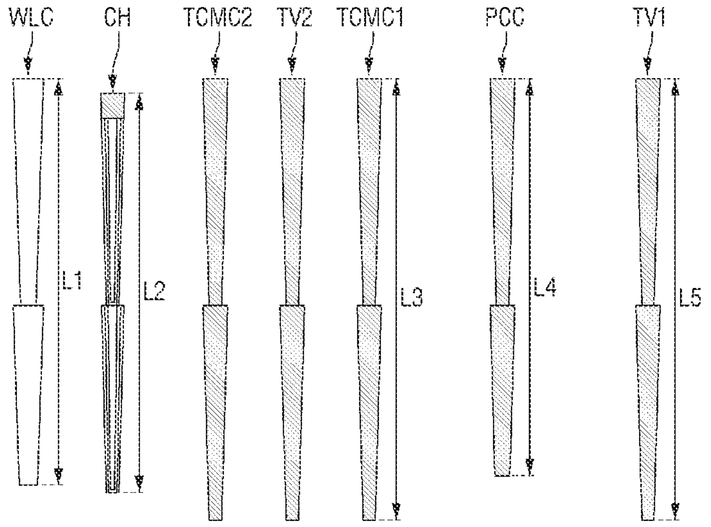
FIG. 7 is a view illustrating pillars according to some embodiments of the present invention.
Figure 8:
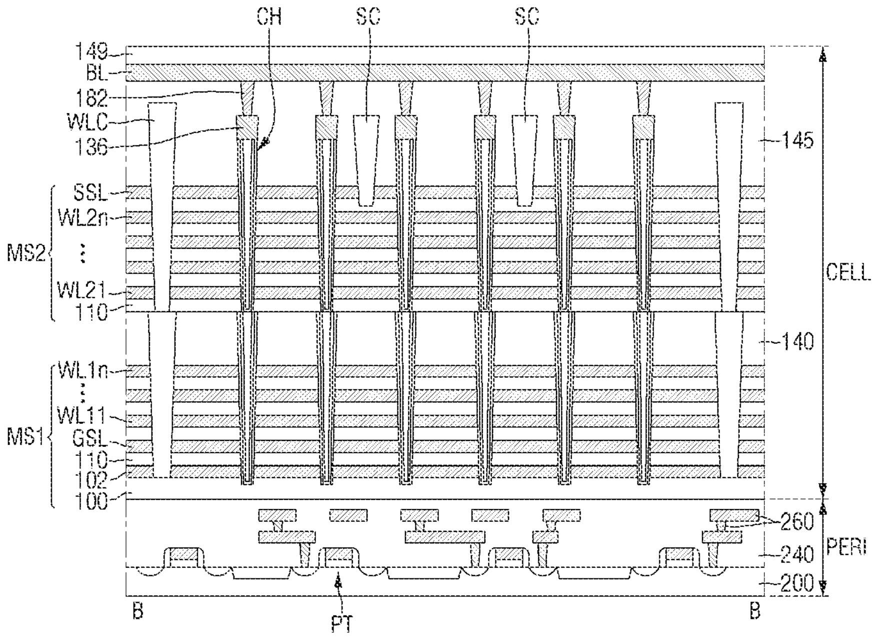
FIG. 8 is a cross-sectional view taken along line B-B of FIG. 3.

FIG. 3 is a layout diagram illustrating a semiconductor memory device according to some embodiments of the present invention. FIG. 4 is a cross-sectional view taken along line A-A of FIG. 3. FIGS. 5 and 6 are enlarged cross-sectional views illustrating a region S1 of FIG. 4. FIG. 7 is a view illustrating pillars according to some embodiments of the present invention. FIG. 8 is a cross-sectional view taken along line B-B of FIG. 3.

Referring to FIGS. 3 to 8, a semiconductor memory device 10 according to some embodiments of the present invention may include a memory cell region CELL and a peripheral circuit region PERI.

The memory cell region CELL may include a cell substrate 100, a first mold structure MS1, an interlayer insulating layer 140, a second mold structure MS2, an interlayer insulating layer 145, a channel structure CH, a word line cut region WLC, a bit line BL, an insulating ring 116, a first cell contact structure TCMC1, a second cell contact structure TCMC2, a first through via TV1, a second through via TV2, a common source line contact PCC, a first wiring structure 180, a bit line contact 182, a metal contact 184, and a first inter-wiring insulating layer 149.

The cell substrate 100 may include, for example, a semiconductor substrate such as a silicon substrate, a germanium substrate, or a silicon-germanium substrate. In some embodiments, the cell substrate 100 may include a silicon-on-insulator (SOI) substrate and/or a germanium-on-insulator (GOI) substrate. In some embodiments, the cell substrate 100 may include impurities. For example, the cell substrate 100 may include n-type impurities (e.g., phosphorus (P), arsenic (As), etc.). As used herein the term "and/or" includes any and all combinations of one or more of the associated listed items.

The cell substrate 100 may include a cell array region R1, a first extension region R2, a second extension region R3, and a through region R4. Here, the cell array region R1, the first extension region R2, the second extension region R3, and the through region R4 may be sequentially arranged in the first direction X, as illustrated in FIGS. 3 and 4.

The memory cell array 20 including the plurality of memory cells may be formed in the cell array region R1. For example, a channel structure CH, a bit line BL, and gate electrodes GSL, WL11 to WL1*n*, WL21 to WL2*n*, and SSL, which will be described later, may be disposed in the cell array region R1. In the following description, a surface of the cell substrate 100 on which the memory cell array 20 is disposed may be referred to as a front side of the cell substrate 100. Conversely, a surface of the cell substrate 100 opposite to the front side of the cell substrate 100 may be referred to as a back side of the cell substrate 100. The front side and the back side of the cell substrate 100 may be parallel to the first direction X. As used herein, "an element A in a region X (e.g., the cell array region R1, the first extension region R2, the second extension region R3 or the through region R4)" may mean that the element A is on the region X and thus overlaps the region X in a third direction Z.

The first and second extension regions R2 and R3 may be disposed around the cell array region R1. Gate electrodes GSL, WL11 to WL1*n*, WL21 to WL2*n*, and SSL, which will be described later, may be stacked in the first and second extension regions R2 and R3 in a stepwise manner.

In some embodiments, the cell substrate 100 may include a through region R4. The through region R4 may be disposed inside the cell array region R1 and the first and second extension regions R2 and R3, or may be disposed outside the cell array region R1 and the first and second extension regions R2 and R3. A first through via TV1 to be described later may be disposed in the through region R4.

The first mold structure MS1 may be formed on the front side (e.g., the top surface) of the cell substrate 100. The first mold structure MS1 may include a plurality of first gate electrodes GSL and WL11 to WL1*n* and a plurality of mold insulating layers 110 alternately stacked on the cell substrate 100. Each of the first gate electrodes GSL and WL11 to WL1*n* and each of the mold insulating layers 110 may have a layered structure extending parallel to the top surface of the cell substrate 100. The first gate electrodes GSL and WL11 to WL1*n* may be spaced apart from each other by the mold insulating layers 110 and may be sequentially stacked on the cell substrate 100.

The first gate electrodes GSL and WL11 to WL1*n* may be stacked in the second extension region R3 in a stepwise manner. For example, the first gate electrodes GSL and WL11 to WL In may extend in the first direction X to have different lengths (e.g., lengths in the first direction X) to have a step difference. In addition, the first gate electrodes GSL and WL11 to WL In may have a step difference in the second direction Y. Accordingly, the first gate electrodes GSL and WL11 to WL1*n* may include a first pad region CP1 exposed from other first gate electrodes GSL and WL11 to WL1*n*. As used herein, "an element A extends in a direction X" (or similar language) may mean that the element A extends longitudinally in the direction X.

In some embodiments, the first gate electrodes GSL and WL11 to WL1*n* may include a ground selection line GSL and a plurality of first word lines WL11 to WL1*n* sequentially stacked on the cell substrate 100. Here, the erase control line ECL of FIG. 2 is omitted, but the present invention is not limited thereto.

The interlayer insulating layer 140 may be formed on the cell substrate 100. The interlayer insulating layer 140 may cover the first mold structure MS1. The interlayer insulating layer 140 may be formed along the cell array region R1, the first extension region R2, the second extension region R3, and the through region R4. The interlayer insulating layer 140 may be conformally formed along the first gate electrodes GSL and WL11 to WL In of the second extension region R3. That is, the interlayer insulating layer 140 may be formed along the first pad region CP1 of the first gate electrodes GSL and WL11 to WL1*n* of the second extension region R3. A more detailed description of the interlayer insulating layer 140 will be provided later.

The interlayer insulating layer 140 may include, for example, at least one of silicon oxide, silicon oxynitride, and a low-k material having a dielectric constant lower than that of silicon oxide, but is not limited thereto.

The second mold structure MS2 may be formed on the first mold structure MS1 and the interlayer insulating layer 140. The second mold structure MS2 may include a plurality of second gate electrodes WL21 to WL2*n* and SSL and a plurality of mold insulating layers 110 alternately stacked on the first mold structure MS1 and the interlayer insulating layer 140. Each of the second gate electrodes WL21 to WL2*n* and SSL and each of the mold insulating layers 110 may have a layered structure extending parallel to the top surface of the cell substrate 100. The second gate electrodes WL21 to WL2*n* and SSL may be spaced apart from each other by the mold insulating layers 110 and may be sequentially stacked on the first mold structure MS1 and the interlayer insulating layer 140.

The second gate electrodes WL21 to WL2*n* and SSL may be disposed in the cell array region R1 and the first extension region R2. That is, the second gate electrodes WL21 to WL2*n* and SSL may not be disposed in the second extension region R3 and the through region R4. The second gate electrodes WL21 to WL2*n* and SSL may be stacked in the first extension region R2 in a stepwise manner. Accordingly, each of the second gate electrodes WL21 to WL2*n* and SSL may include a second pad region CP2 exposed from other second gate electrodes. Accordingly, the second pad region CP2 may be positioned in the first extension region R2, and the first pad region CP1 may be positioned in the second extension region R3. That is, the second pad region CP2 does not overlap the first pad region CP1.

In some embodiments, the second gate electrodes WL21 to WL2*n* and SSL may include a plurality of second word lines WL21 to WL2*n* and a string select line SSL sequentially stacked on the first mold structure MS1. In some embodiments, the second mold structure MS2 may include a plurality of string select lines SSL.

The interlayer insulating layer 145 may be formed on the first mold structure MS1 and the interlayer insulating layer 140. The interlayer insulating layer 145 may cover the second mold structure MS2. The interlayer insulating layer 145 may be formed along the cell array region R1, the first extension region R2, the second extension region R3, and the through region R4. The interlayer insulating layer 145 may be conformally formed along the second gate electrodes WL21 to WL2*n* and SSL of the first extension region R1. That is, the interlayer insulating layer 145 may be formed along the second pad region CP2 of the second gate electrodes WL21 to WL2*n* and SSL of the first extension region R2. A more detailed description of the interlayer insulating layer 145 will be provided later.

The interlayer insulating layer 145 may include, for example, at least one of silicon oxide, silicon oxynitride, and a low-k material having a dielectric constant lower than that of silicon oxide, but is not limited thereto.

Each of the gate electrodes GSL, WL11 to WL1*n*, WL21 to WL2*n*, and SSL may include a conductive material, for example, a metal such as tungsten (W), cobalt (Co), or nickel (Ni), or a semiconductor material such as silicon, but is not limited thereto. For example, each of the gate electrodes GSL, WL11 to WL1_n_, WL21 to WL2_n_, and SSL may include tungsten (W).

The mold insulating layer 110 may include an insulating material, for example, at least one of silicon oxide, silicon nitride, and silicon oxynitride, but is not limited thereto. For example, the mold insulating layer 110 may include silicon oxide.

The channel structure CH may be formed in the first mold structure MS1 and the second mold structure MS2 of the cell array region R1. The channel structure CH may extend in a vertical direction (hereinafter, referred to as a third direction Z) crossing the top surface of the cell substrate 100 to penetrate through the first mold structure MS1 and the second mold structure MS2. For example, the channel structure CH may have a pillar shape (e.g., a cylindrical shape) extending in the third direction Z. Accordingly, the channel structure CH may cross each of the gate electrodes GSL, WL11 to WL1_n_, WL21 to WL2_n_, and SSL. In some embodiments, the channel structure CH may have a bent portion between the first mold structure MS1 and the second mold structure MS2. This may be due to characteristics of an etching process for forming the channel structure CH, but is not limited thereto.

Referring to FIG. 5, the channel structure CH may include a semiconductor pattern 130 and an information storage layer 132.

The semiconductor pattern 130 may extend in the third direction Z and penetrate through the first mold structure MS1 and the second mold structure MS2. The semiconductor pattern 130 is illustrated only in the shape of a cup, but this is only provided as an example. For example, the semiconductor pattern 130 may also have various shapes, such as a cylindrical shape, a rectangular shape, and a closely packed pillar shape. The semiconductor pattern 130 may include, for example, a semiconductor material such as single crystal silicon, polycrystalline silicon, an organic semiconductor material, and a carbon nanostructure, but is not limited thereto.

The information storage layer 132 may be interposed between the semiconductor pattern 130 and each of the gate electrodes GSL, WL11 to WL1_n_, WL21 to WL2_n_, and SSL. For example, the information storage layer 132 may extend along an outer side surface of the semiconductor pattern 130. The information storage layer 132 may include, for example, at least one of silicon oxide, silicon nitride, silicon oxynitride, and a high-k material having a higher dielectric constant than the silicon oxide. The high-k material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the plurality of channel structures CH may be arranged in a zigzag shape. For example, as illustrated in FIG. 3, the plurality of channel structures CH may be arranged to be misaligned with each other in the first direction X and the second direction Y. The plurality of channel structures CH arranged in the zigzag shape may further improve a degree of integration of a semiconductor memory device. In some embodiments, the plurality of channel structures CH may be arranged in a honeycomb shape. In FIG. 3, 14 channel structures CH may be formed between the plurality of word line cut regions WLC, but the present invention is not limited thereto.

In some embodiments, a dummy channel structure DCH may be formed in the second mold structure MS2 of the first extension region R2 and the first mold structure MS1 of the second extension region R3. The dummy channel structure DCH may be formed in a shape similar to that of the channel structure CH to reduce stress applied to the first and second mold structures MS1 and MS2 in the first and second extension regions R2 and R3.

In some embodiments, the information storage layer 132 may be formed as multiple layers. For example, as illustrated in FIG. 5, the information storage layer 132 may include a tunnel insulating layer 132_a_, a charge storage layer 132_b_, and a blocking insulating layer 132_c_ sequentially stacked on the outer side surface of the semiconductor pattern 130.

The tunnel insulating layer 132_a_ may include, for example, silicon oxide or a high-k material (e.g., aluminum oxide ($Al_2O_3$) or hafnium oxide ($HfO_2$)) having a higher dielectric constant than the silicon oxide. The charge storage layer 132_b_ may include, for example, silicon nitride. The blocking insulating layer 132_c_ may include, for example, silicon oxide or a high-k material (e.g., aluminum oxide ($Al_2O_3$) or hafnium oxide ($HfO_2$)) having a higher dielectric constant than the silicon oxide.

In some embodiments, the channel structure CH may further include a filling pattern 134. The filling pattern 134 may be formed to fill an inner portion of the semiconductor pattern 130 having a cup shape. The filling pattern 134 may include an insulating material, for example, silicon oxide, but is not limited thereto.

In some embodiments, the channel structure CH may further include a channel pad 136. The channel pad 136 may be formed to be connected to the semiconductor pattern 130. For example, the channel pad 136 may be formed in the interlayer insulating layer 145 to be connected to an upper portion of the semiconductor pattern 130. The channel pad 136 may include, for example, polysilicon doped with impurities, but is not limited thereto.

In some embodiments, a source layer 102 may be formed on the cell substrate 100. The source layer 102 may be interposed between the cell substrate 100 and the first mold structure MS1. For example, the source layer 102 may extend along the top surface of the cell substrate 100. The source layer 102 may be formed to be connected to the semiconductor pattern 130 of the channel structure CH. For example, as illustrated in FIG. 5, the source layer 102 may penetrate through the information storage layer 132 to be in contact with the semiconductor pattern 130. The source layer 102 may be provided as a common source line (e.g., CSL of FIG. 2) of the semiconductor memory device 10. The source layer 102 may include, for example, polysilicon or metal doped with impurities, but is not limited thereto. In addition, the source layer 102 may further include another source layer 104 disposed under the mold insulating layer 110.

In some embodiments, the channel structure CH may penetrate through the source layer 102. For example, a lower portion of the channel structure CH may penetrate through the source layer 102 and be buried in the cell substrate 100. However, the channel structure CH may not be directly connected to the peripheral circuit region PERI.

The source layer 102 and the source layer 104 may include, but are not limited to, polysilicon doped with impurities or polysilicon undoped with impurities. The source layer 102 may be in contact with the semiconductor pattern 130 and provided as a common source line (e.g., CSL of FIG. 2) of the semiconductor memory device. The source layer 104 may be used as a support layer to reduce or prevent collapsing or falling-down of the mold stack in a replacement process for forming the source layer 102.

Referring to FIG. 6, the semiconductor memory device according to some embodiments of the present invention may include a second source structure 106.

The second source structure 106 may be formed on the cell substrate 100. Although it is illustrated that a lower portion of the second source structure 106 is buried in the cell substrate 100, this is only provided as an example, and the present invention is not limited thereto. The second source structure 106 may be connected to the semiconductor pattern 130 of the channel structure CH. For example, the semiconductor pattern 130 may penetrate through the information storage layer 132 to be in contact with the top surface of the second source structure 106. The second source structure 106 may be formed by, for example, a selective epitaxial growth process from the cell substrate 100, but is not limited thereto.

In some embodiments, the top surface of the second source structure 106 may cross some of the gate electrodes GSL, WL11 to WL1*n*, WL21 to WL2*n*, and SSL. For example, the top surface of the second source structure 106 may be formed to be higher than the top surface of the ground selection line GSL. In this case, a gate insulating layer 110S may be interposed between the second source structure 106 and the gate electrode crossing the second source structure 106.

Referring back to FIGS. 3 to 8, the word line cut region WLC may extend in the first direction X to cut the first mold structure MS1 and the second mold structure MS2. The first mold structure MS1 and the second mold structure MS2 may be cut by the word line cut regions WLC to form a plurality of memory cell blocks (e.g., BLK1 to BLKn of FIG. 1). For example, two adjacent word line cut regions WLC may define one memory cell block therebetween. The plurality of channel structures CH may be disposed in each of the memory cell blocks defined by the word line cut regions WLC.

In FIG. 3, although it is illustrated that the number of channel structures CH arranged in a zigzag along the second direction Y in one memory cell block is only 14, but this is only provided as an example. The number of channel structures CH disposed in each of the memory cell blocks is not limited to the illustrated one and may be variously varied.

In some embodiments, the word line cut region WLC may extend in the first direction X to cut the source layer 102. Although it is illustrated that a bottom surface of the word line cut region WLC is coplanar with a bottom surface of the source layer 102, this is only provided as an example. In some embodiments, the bottom surface of the word line cut region WLC may be lower than the bottom surface of the source layer 102.

In some embodiments, the word line cut region WLC may include an insulating material. For example, the word line cut region WLC may be filled with the insulating material. The insulating material may include, for example, at least one of silicon oxide, silicon nitride, and silicon oxynitride, but is not limited thereto.

In some embodiments, a string separation structure SC may be formed in the second mold structure MS2. The string separation structure SC may extend in the first direction X to cut the string select line SSL. Each of the memory cell blocks defined by the word line cut regions WLC may be divided by the string separation structure SC to form a plurality of string regions. For example, the string separation structures SC may define three string regions in one memory cell block.

The bit line BL may be formed on the second mold structure MS2 and the interlayer insulating layer 145. The bit line BL may extend in the second direction Y to cross the word line cut region WLC. In addition, the bit line BL may extend in the second direction Y to be connected to the plurality of channel structures CH arranged along the second direction Y. For example, a bit line contact 182 connected to an upper portion of each of the channel structures CH may be formed in the interlayer insulating layer 145. The bit line BL may be electrically connected to the channel structures CH through the bit line contact 182.

The first cell contact structure TCMC1 may be formed on the second extension region R3. The first cell contact structure TCMC1 may extend in the third direction Z in the second extension region R3 to penetrate through the first mold structure MS1. Here, the first cell contact structure TCMC1 may not penetrate through the second mold structure MS2. The first cell contact structure TCMC1 may be connected to each of the first gate electrodes GSL and WL11 to WL In in the first pad region CP1. Here, the first cell contact structure TCMC1 may penetrate through the first gate electrodes GSL and WL11 to WL1*n* stacked in a stepwise manner.

In addition, the first cell contact structure TCMC1 may penetrate through the interlayer insulating layer 140, the interlayer insulating layer 145, and the cell substrate 100. The first cell contact structure TCMC1 may be directly connected to a second wiring structure 260 of the peripheral circuit region PERI. In addition, the first cell contact structure TCMC1 may be directly connected to the first wiring structure 180 through the metal contact 184. Here, the first cell contact structure TCMC1 may have a bent portion, but the present invention is not limited thereto.

The second cell contact structure TCMC2 may be formed on the first extension region R2. The second cell contact structure TCMC2 may extend in the third direction Z in the first extension region R2 to penetrate through the first mold structure MS1 and the second mold structure MS2. The second cell contact structure TCMC2 may be connected to each of the second gate electrodes WL21 to WL2*n* and SSL in the second pad region CP2. Here, the second cell contact structure TCMC2 may penetrate through the second gate electrodes WL21 to WL2*n* and SSL stacked in a stepwise manner.

In addition, the second cell contact structure TCMC2 may penetrate through the interlayer insulating layer 140, the interlayer insulating layer 145, and the cell substrate 100. The second cell contact structure TCMC2 may be directly connected to the second wiring structure 260 of the peripheral circuit region PERI. In addition, the second cell contact structure TCMC2 may be directly connected to the first wiring structure 180 through the metal contact 184. Here, the second cell contact structure TCMC2 may have a bent portion, but the present invention is not limited thereto.

The first through via TV1 may be disposed in the through region R4. The first through via TV1 may penetrate through the interlayer insulating layer 140, the interlayer insulating layer 145, and the cell substrate 100 of the through region R4. The first through via TV1 may be directly connected to the second wiring structure 260 of the peripheral circuit region PERI. The first through via TV1 may be directly connected to the first wiring structure 180 through the metal contact 184. Here, the first through via TV1 may have a bent portion, but the present invention is not limited thereto. This may be due to characteristics of an etching process for forming the first through via TV1, but is not limited thereto. In some embodiments, the first through via TV1 may be formed at the same level as the first and second cell contact structures TCMC1 and TCMC2. In the present specification, the term "same level" refers to formation by the same manufacturing process.

The second through via TV2 may be disposed in the first extension region R2. The second through via TV2 may penetrate through the interlayer insulating layer 140, the interlayer insulating layer 145, the first mold structure MS1, the second mold structure MS2, and the cell substrate 100 of the first extension region R2. The second through via TV2 may be directly connected to the second wiring structure 260 of the peripheral circuit region PERI. The second through via TV2 may be directly connected to the first wiring structure 180 through the metal contact 184. Here, the second through via TV2 may have a bent portion, but the present invention is not limited thereto. In some embodiments, the second through via TV2 may be formed at the same level as the first and second cell contact structures TCMC1 and TCMC2.

The common source line contact PCC may be disposed in the second extension region R3. The common source line contact PCC may penetrate through the interlayer insulating layer 140 and the interlayer insulating layer 145 of the second extension region R3. A common source line contact PCC may be disposed in the source layer 102. The common source line contact PCC may be electrically connected to the source layer 102. The source layer 102 may be applied with a voltage from the common source line contact PCC to maintain a ground voltage. The common source line contact PCC may not be directly connected to the peripheral circuit region PERI.

Each of the first and second cell contact structures TCMC1 and TCMC2, the first and second through vias TV1 and TV2, and the common source line contact PCC may include a conductive material, for example, a metal such as tungsten (W), cobalt (Co), or nickel (Ni) or a semiconductor material such as silicon, but is not limited thereto. As an example, each of the first and second cell contact structures TCMC1 and TCMC2, the first and second through vias TV1 and TV2, and the common source line contact PCC may include tungsten (W).

Referring to FIG. 7, the word line cut region WLC may have a first length L1 in the third direction Z, the channel structure CH may have a second length L2 in the third direction Z, the first cell contact structure TCMC1, the second cell contact structure TCMC2, and the second through via TV2 may have a third length L3 in the third direction Z, the common source line contact PCC may have a fourth length L4 in the third direction Z, and the first through via TV1 may have a fifth length L5 in the third direction Z.

Here, the third length L3 and the fifth length L5 may be greater than the first length L1, the second length L2, and the fourth length L4. The fourth length L4 may be greater than the second length L2. In addition, a width (e.g., a width in the first direction X) of the first and second cell contact structures TCMC1 and TCMC2 may be greater than a width (e.g., a width in the first direction X) of the channel structure CH. However, the present invention is not limited thereto.

Referring back to FIG. 4, the insulating ring 116 may be formed in the first mold structure MS1 and the second mold structure MS2. The insulating ring 116 may be interposed between the first cell contact structure TCMC1 and each of the first gate electrodes GSL and WL11 to WL1*n*, and may be interposed between the second cell contact structure TCMC2 and each of the first and second gate electrodes GSL, WL11 to WL1*n*, WL21 to WL2*n*, and SSL. For example, the insulating ring 116 may be an annular structure surrounding the first and second cell contact structures TCMC1 and TCMC2.

The insulating ring 116 may be interposed between the second through via TV2 and each of the first gate electrodes GSL and WL11 to WL1*n* and the second gate electrodes WL21 to WL2*n*.

The insulating ring 116 may electrically isolate other gate electrodes that are not exposed in the first pad region CP1 and the second pad region CP2 among the first and second gate electrodes GSL, WL11 to WL1*n*, WL21 to WL2*n*, and SSL. For example, the first and second cell contact structures TCMC1 and TCMC2 may be electrically connected to the first and second gate electrodes GSL, WL11, WL21 to WL2*n*, and SSL exposed to the first and second pad regions CP1 and CP2 through the insulating ring 116.

The peripheral circuit region PERI may include a peripheral circuit board 200, a peripheral circuit element PT, a second wiring structure 260, and a second inter-wiring insulating layer 240.

The peripheral circuit board 200 may be disposed under the cell substrate 100. For example, a top surface of the peripheral circuit board 200 may face a bottom surface of the cell substrate 100. The peripheral circuit board 200 may include, for example, a semiconductor substrate such as a silicon substrate, a germanium substrate, or a silicon-germanium substrate. In some embodiments, the peripheral circuit board 200 may also include a silicon-on-insulator (SOI) substrate or a germanium-on-insulator (GOI) substrate.

The peripheral circuit element PT may be formed on the peripheral circuit board 200. The peripheral circuit element PT may constitute a peripheral circuit (e.g., 30 of FIG. 1) that controls the operation of the semiconductor memory device. For example, the peripheral circuit element PT may include control logic (e.g., 37 of FIG. 1), a row decoder (e.g., 33 of FIG. 1), and a page buffer (e.g., 35 of FIG. 1). In the following description, a surface of the peripheral circuit board 200 on which the peripheral circuit element PT is disposed may be referred to as a front side of the peripheral circuit board 200. Conversely, a surface of the peripheral circuit board 200 opposite to the front side of the peripheral circuit board 200 may be referred to as a back side of the peripheral circuit board 200.

The peripheral circuit element PT may include, for example, a transistor, but is not limited thereto. For example, the peripheral circuit element PT may include various active elements such as transistors, as well as various passive elements such as capacitors, resistors, and inductors.

In some embodiments, the rear side of the cell substrate 100 may face the front side of the peripheral circuit board 200. For example, the second inter-wiring insulating layer 240 covering the peripheral circuit element PT may be formed on the front side of the peripheral circuit board 200. The cell substrate 100 may be stacked on a top surface of the second inter-wiring insulating layer 240.

The first wiring structure 180 may be connected to the peripheral circuit element PT through the first through via TV1 and/or the second through via TV2. For example, the second wiring structure 260 connected to the peripheral circuit element PT may be formed in the second inter-wiring insulating layer 240. The second through via TV2 may penetrate through the first and second mold structures MS1 and MS2, respectively, to connect the first wiring structure 180 and the second wiring structure 260. As a result, the bit line BL, each of the gate electrodes GSL, WL11 to WL1n, WL21 to WL2n, and SSL, and/or the source layer 102 may be electrically connected to the peripheral circuit element PT.

Hereinafter, the interlayer insulating layer 140 and the interlayer insulating layer 145 described above will be described in detail with reference to FIGS. 9 to 14. For a more detailed description, although the first and second cell contact structures TCMC1 and TCMC2, the first and second through vias TV1 and TV2, the common source line contact PCC, the insulating ring 116, the channel structure CH, and the word line cut region WLC are not illustrated in FIGS. 9 to 14, the semiconductor memory device 10 according to some embodiments of the present invention may include the above-mentioned components.

Figure 9:
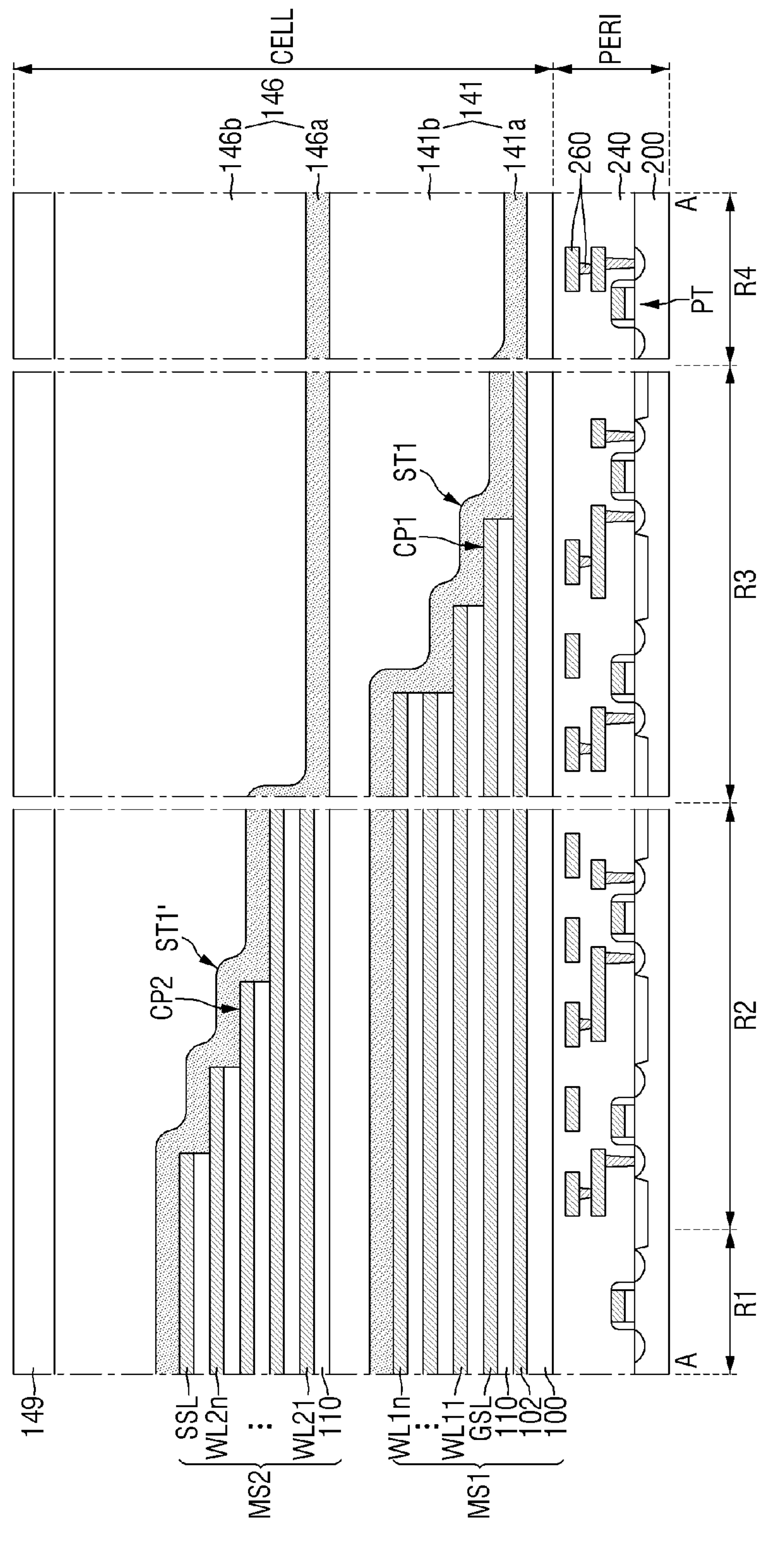
FIG. 9 is a cross-sectional view illustrating a semiconductor memory device including interlayer insulating layers according to some embodiments of the present invention.

FIG. 9 is a cross-sectional view illustrating a semiconductor memory device including interlayer insulating layers according to some embodiments of the present invention.

Referring to FIGS. 4 and 9, an interlayer insulating layer 141 may be stacked on the first mold structure MS1 and the cell substrate 100, and may correspond to the interlayer insulating layer 140 of FIG. 4. An interlayer insulating layer 146 may be stacked on the second mold structure MS2 and the interlayer insulating layer 141, and may correspond to the interlayer insulating layer 145 of FIG. 4.

The interlayer insulating layer 141 may include a first interlayer insulating layer 141a and a second interlayer insulating layer 141b. The first interlayer insulating layer 141a may be doped with impurities, and the second interlayer insulating layer 141b may also be doped with impurities. The doped impurities may include at least one of boron (B), phosphorus (P), and fluorine (F).

The first interlayer insulating layer 141a may be formed along the cell array region R1, the first and second extension regions R2 and R3, and the through region R4. The first interlayer insulating layer 141a may be formed on the first gate electrodes GSL and WL11 to WL In of the cell array region R1 and the first and second extension regions R2 and R3, and may be formed on the cell substrate 100 of the through region R4. The first interlayer insulating layer 141a may be conformally formed on the first gate electrodes GSL and WL11 to WL In in the second extension region R3. That is, the first interlayer insulating layer 141a may be formed along the first pad region CP1 having a step structure of the first gate electrodes GSL and WL11 to WL1n. Accordingly, the first interlayer insulating layer 141a may have a first stair surface ST1. The first interlayer insulating layer 141a may also cover the source layer 102. In some embodiments, the first interlayer insulating layer 141a may extend conformally on the first gate electrodes GSL and WL11 to WL1n and on the cell substrate 100 as illustrated in FIG. 9.

The second interlayer insulating layer 141b may be formed between the first interlayer insulating layer 141a, and the second mold structure MS2 and the interlayer insulating layer 146. That is, the second interlayer insulating layer 141b may be formed in the cell array region R1, the first and second extension regions R2 and R3, and the through region R4 along the first stair surface ST1. A top surface of the second interlayer insulating layer 141b may be parallel to the top surface of the cell substrate 100, but the present invention is not limited thereto.

In some embodiments, an impurity doping concentration of the first interlayer insulating layer 141a may be greater than an impurity doping concentration of the second interlayer insulating layer 141b. That is, the impurity doping concentration of the first interlayer insulating layer 141a in the second extension region R3 and the through region R4 may be greater than the impurity doping concentration of the second interlayer insulating layer 141b. The first cell contact structure TCMC1 and the common source line contact PCC may be formed in the second extension region R3, and the first through via TV1 may be formed in the through region R4. In addition, the cell structure CH may be formed in the cell array region R1, and the second cell contact structure TCMC2 and the second through via TV2 may be formed in the first extension region R2. As used herein, "an impurity doping concentration" may be referred to as "an impurity concentration."

A sacrificial layer formed before the first mold structure MS1 corresponding to the cell array region R1 and the first extension region R2 is formed may include silicon oxynitride. However, the interlayer insulating layer 141 corresponding to the second extension region R3 and the through region R4 may not include silicon oxynitride but may include silicon oxide. Accordingly, as the first mold structure MS1 of the second extension region R3 has a step structure, the second extension region R3 may include less silicon oxynitride.

An etching rate of silicon oxynitride may be greater than an etching rate of silicon oxide. Accordingly, an etching rate of the sacrificial layer formed before the first mold structure MS1 corresponding to the cell array region R1 and the first extension region R2 is formed may be greater than an etching rate of the interlayer insulating layer 141 corresponding to the second extension region R3 and the through region R4.

In the embodiment illustrated in FIG. 9, as the first interlayer insulating layer 141a is disposed in the second extension region R3 and the through region R4, the etching rate of the interlayer insulating layer 141 of the second extension region R3 and the through region R4 may be adjusted. Accordingly, the channel structure CH, the first and second cell contact structures TCMC1 and TCMC2, the first and second through vias TV1 and TV2, and the common source line contact PCC that have different lengths may be simultaneously formed. That is, high aspect ratio contact (HARC) merge etching may be performed. Here, the HARC merge etching means that holes corresponding to the channel structure CH, the first and second cell contact structures TCMC1 and TCMC2, the first and second through vias TV1 and TV2, and the common source line contact PCC are formed by one etching process.

The interlayer insulating layer 146 may include a first interlayer insulating layer 146a and a second interlayer insulating layer 146b. The first interlayer insulating layer 146a may be doped with impurities, and the second interlayer insulating layer 146b may also be doped with impurities. The doped impurities may include at least one of boron (B), phosphorus (P), and fluorine (F).

The first interlayer insulating layer 146a may be formed on the second gate electrodes WL21 to WL2n and SSL of the cell array region R1 and the first extension region R2, and may be formed on the interlayer insulating layer 141 of the second extension region R3 and the through region R4. The first interlayer insulating layer 146a may be conformally formed on the second gate electrodes WL21 to WL2n and SSL in the first extension region R2. That is, the first interlayer insulating layer 146a may be formed along the second pad region CP2 having a step structure of the second gate electrodes WL21 to WL2n and SSL. Accordingly, the first interlayer insulating layer 146a may have a first stair surface ST1'. In some embodiments, the first interlayer insulating layer 146a may extend conformally on the second gate electrodes WL21 to WL2*n* and SSL and on the the interlayer insulating layer 141, as illustrated in FIG. 9.

The second interlayer insulating layer 146*b* may be formed on the first interlayer insulating layer 146*a*. That is, the second interlayer insulating layer 146*b* may be formed in the cell array region R1, the first and second extension regions R2 and R3, and the through region R4 along the first stair surface ST1'. A top surface of the second interlayer insulating layer 146*b* may be parallel to the top surface of the cell substrate 100, but the present invention is not limited thereto.

In some embodiments, an impurity doping concentration of the first interlayer insulating layer 146*a* may be greater than an impurity doping concentration of the second interlayer insulating layer 146*b*. That is, the impurity doping concentration of the first interlayer insulating layer 146*a* in the first extension region R2, the second extension region R3, and the through region R4 may be greater than the impurity doping concentration of the second interlayer insulating layer 146*b*. The second cell contact structure TCMC2 and the second through via TV1 may be formed in the first extension region R2, the first cell contact structure TCMC1 and the common source line contact PCC may be formed in the second extension region R3, and the first through via TV1 may be formed in the through region R4. In addition, the cell structure CH may be formed in the cell array region R1.

A sacrificial layer before the second mold structure MS2 corresponding to the cell array region R1 is formed may include silicon oxynitride. However, the interlayer insulating layer 146 corresponding to the first and second extension regions R2 and R3 and the through region R4 may not include silicon oxynitride but may include silicon oxide. Accordingly, as the second mold structure MS2 of the first extension region R2 has a step structure, the first extension region R2 may include less silicon oxynitride.

An etching rate of the sacrificial layer formed before the first mold structure MS1 corresponding to the cell array region R1 is formed may be greater than an etching rate of the interlayer insulating layer 146 corresponding to the first and second extension regions R2 and R3 and the through region R4.

In the embodiment illustrated in FIG. 9, as the first interlayer insulating layer 146*a* is disposed in the first and second extension regions R2 and R3 and the through region R4, the etching rate of the interlayer insulating layer 146 of the first and second extension regions R2 and R3 and the through region R4 may be adjusted. Accordingly, the channel structure CH, the first and second cell contact structures TCMC1 and TCMC2, the first and second through vias TV1 and TV2, and the common source line contact PCC that have different lengths may be simultaneously formed.

As described above, as the first and second interlayer insulating layers 141*a* and 141*b* covering the first mold structure MS1 and having different impurity doping concentrations, and the first and second interlayer insulating layers 146*a* and 146*b* covering the second mold structure MS2 and having different impurity doping concentrations are formed, the channel structure CH, the first and second cell contact structures TCMC1 and TCMC2, the first and second through vias TV1 and TV2, and the common source line contact PCC may be simultaneously formed, and the semiconductor memory device 10 having improved reliability and having a multi-stack may be provided.

In addition, the impurity doping concentration of the interlayer insulating layer 141 and the impurity doping concentration of the interlayer insulating layer 146 may be different from each other. For example, the impurity doping concentration of the interlayer insulating layer 141 may be greater than the impurity doping concentration of the interlayer insulating layer 146. However, the present invention is not limited thereto.

Figure 10:
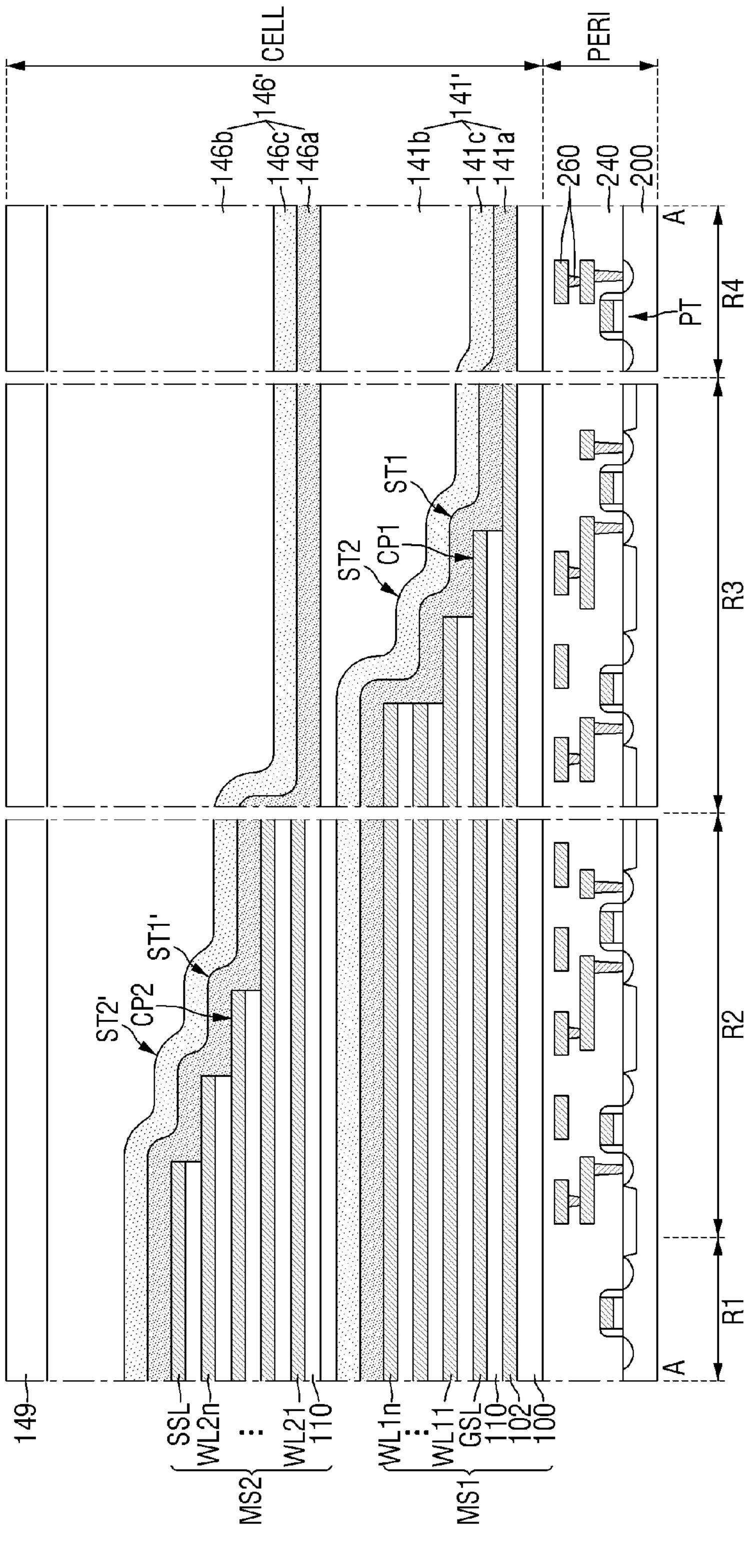
FIG. 10 is a cross-sectional view illustrating a semiconductor memory device including interlayer insulating layers according to some embodiments of the present invention.

FIG. 10 is a cross-sectional view illustrating a semiconductor memory device including interlayer insulating layers according to some embodiments of the present invention. A description overlapping with FIG. 9 will be omitted.

Referring to FIGS. 4 and 10, an interlayer insulating layer 141' may be stacked on the first mold structure MS1 and the cell substrate 100, and may correspond to the interlayer insulating layer 140 of FIG. 4. An interlayer insulating layer 146' may be stacked on the second mold structure MS2 and the interlayer insulating layer 141', and may correspond to the interlayer insulating layer 145 of FIG. 4.

The interlayer insulating layer 141' may further include a third interlayer insulating layer 141*c* interposed between the first interlayer insulating layer 141*a* and the second interlayer insulating layer 141*b*. The third interlayer insulating layer 141*c* may be formed along the first stair surface ST1 of the first interlayer insulating layer 141*a*. The third interlayer insulating layer 141*c* may be formed in the cell array region R1, the first and second extension regions R2 and R3, and the through region R4. The third interlayer insulating layer 141*c* may have a second stair surface ST2. That is, the second interlayer insulating layer 141*b* may be formed on the second stair surface ST2.

An impurity doping concentration of the first interlayer insulating layer 141*a*, an impurity doping concentration of the second interlayer insulating layer 141*b*, and an impurity doping concentration of the third interlayer insulating layer 141*c* may be different from each other. For example, the impurity doping concentration of the first interlayer insulating layer 141*a* may be greater than the impurity doping concentrations of the second and third interlayer insulating layers 141*b* and 141*c*. The impurity doping concentration of the third interlayer insulating layer 141*c* may be greater than the impurity doping concentration of the second interlayer insulating layer 141*b*. Accordingly, holes may be smoothly formed in the interlayer insulating layer 141'.

The interlayer insulating layer 146' may further include a third interlayer insulating layer 146*c* interposed between the first interlayer insulating layer 146*a* and the second interlayer insulating layer 146*b*. The third interlayer insulating layer 146*c* may be formed along the first stair surface ST1' of the first interlayer insulating layer 146*a*. The third interlayer insulating layer 146*c* may be formed in the cell array region R1, the first and second extension regions R2 and R3, and the through region R4. The third interlayer insulating layer 146*c* may have a second stair surface ST2'. That is, the second interlayer insulating layer 146*b* may be formed on the second stair surface ST2'.

An impurity doping concentration of the first interlayer insulating layer 146*a*, an impurity doping concentration of the second interlayer insulating layer 146*b*, and an impurity doping concentration of the third interlayer insulating layer 146*c* may be different from each other. For example, the impurity doping concentration of the first interlayer insulating layer 146*a* may be greater than the impurity doping concentrations of the second and third interlayer insulating layers 146*b* and 146*c*. The impurity doping concentration of the third interlayer insulating layer 146*c* may be greater than the impurity doping concentration of the second interlayer insulating layer 146*b*. Accordingly, holes may be smoothly formed in the interlayer insulating layer 146'.

Figure 11:
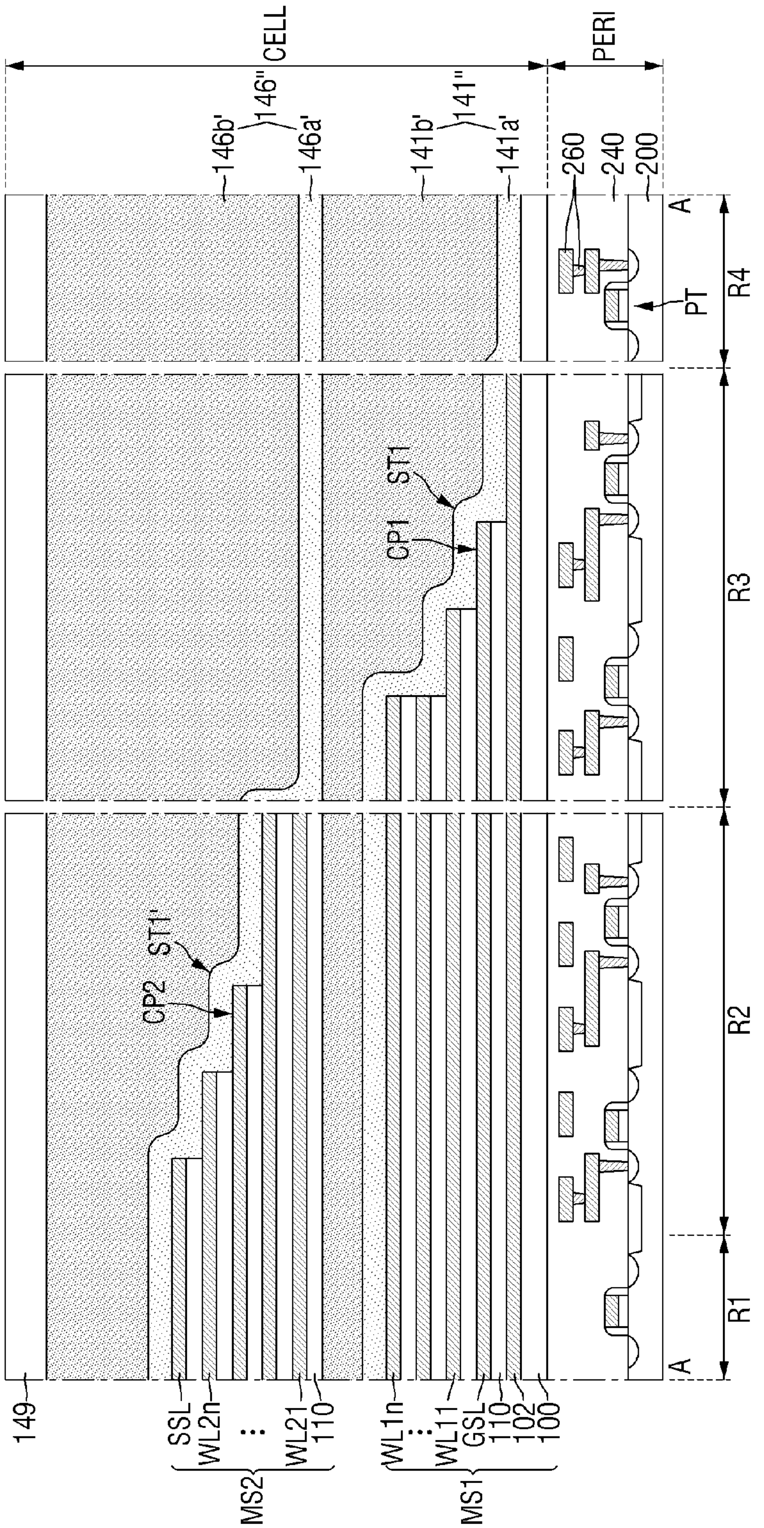
FIG. 11 is a cross-sectional view illustrating a semiconductor memory device including interlayer insulating layers according to some embodiments of the present invention.

FIG. 11 is a cross-sectional view illustrating a semiconductor memory device including interlayer insulating layers according to some embodiments of the present invention.

Referring to FIG. 11, an interlayer insulating layer 141" may include a first interlayer insulating layer 141*a*' and a second interlayer insulating layer 141*b*'. An interlayer insulating layer 146" may include a first interlayer insulating layer 146*a*' and a second interlayer insulating layer 146*b*'.

In the embodiment illustrated in FIG. 10, an impurity doping concentration of the second interlayer insulating layer 141*b*' may be greater than an impurity doping concentration of the first interlayer insulating layer 141*a*'. In addition, an impurity doping concentration of the second interlayer insulating layer 146*b*' may be greater than an impurity doping concentration of the first interlayer insulating layer 146*a*'. However, the present invention is not limited thereto.

Figure 12:
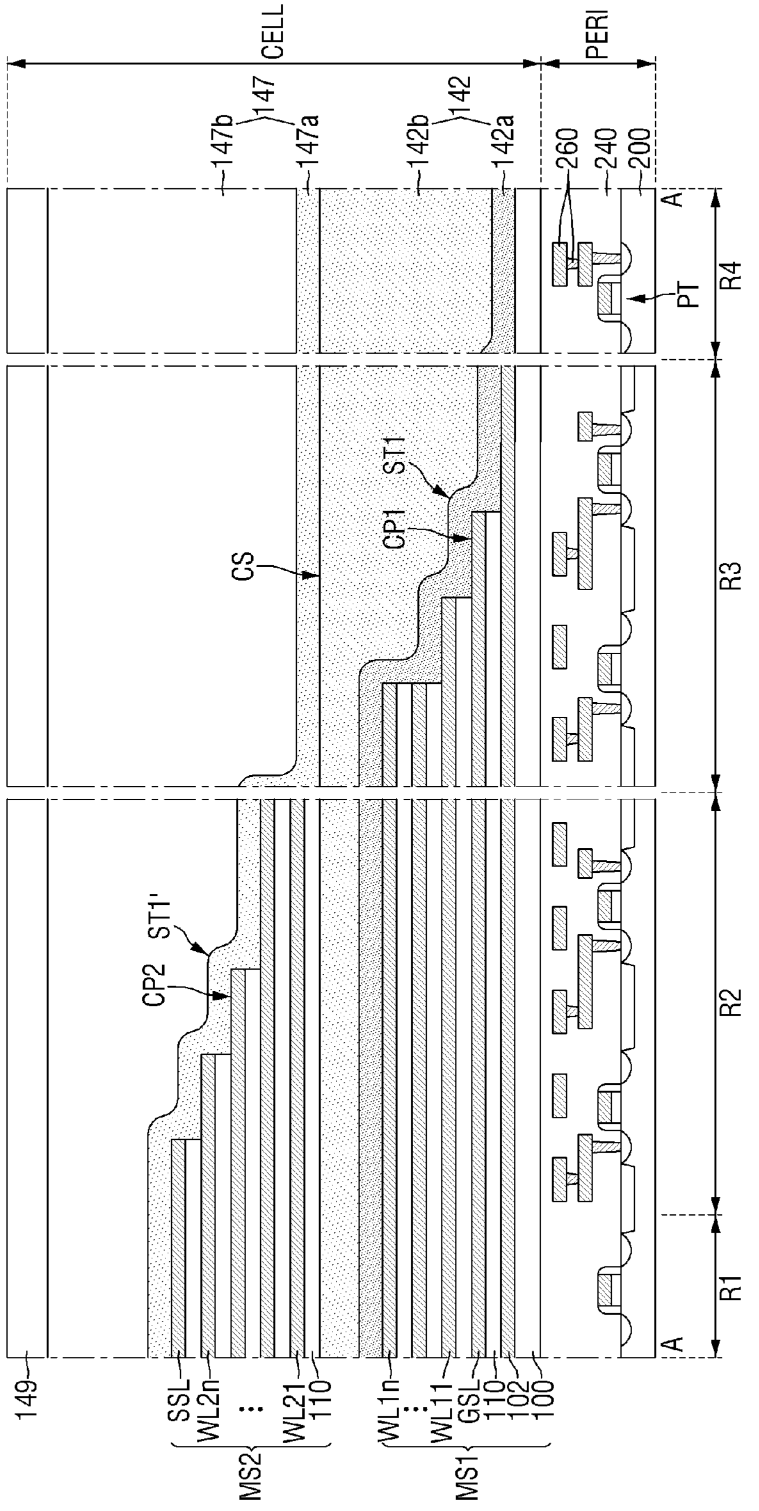
FIG. 12 is a cross-sectional view illustrating a semiconductor memory device including interlayer insulating layers according to some embodiments of the present invention.

FIG. 12 is a cross-sectional view illustrating a semiconductor memory device including interlayer insulating layers according to some embodiments of the present invention.

Referring to FIGS. 4 and 12, an interlayer insulating layer 142 may correspond to the interlayer insulating layer 140 of FIG. 4, and an interlayer insulating layer 147 may correspond to the interlayer insulating layer 145 of FIG. 4.

The interlayer insulating layer 142 may include a first interlayer insulating layer 142*a* and a second interlayer insulating layer 142*b*. The interlayer insulating layer 147 may include a first interlayer insulating layer 147*a* and a second interlayer insulating layer 147*b*. Here, the second interlayer insulating layer 142*b* and the first interlayer insulating layer 147*a* may be in contact with each other. In addition, an impurity doping concentration of the second interlayer insulating layer 142*b* and an impurity doping concentration of the first interlayer insulating layer 147*a* may be the same.

Accordingly, the memory cell region CELL may have three different impurity doping concentrations in the first extension region R2, the second extension region R3, and the through region R4.

Figure 13:
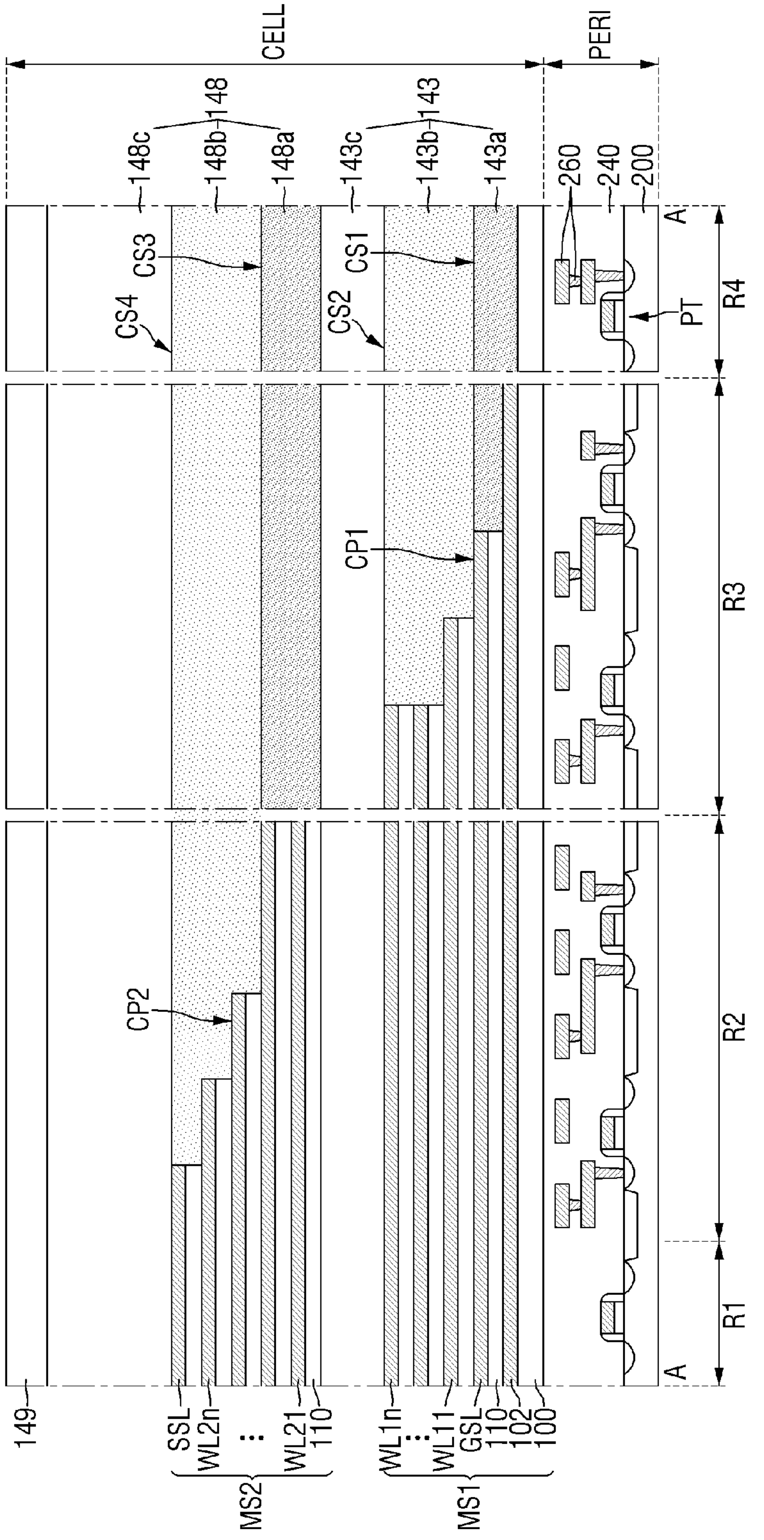
FIG. 13 is a cross-sectional view illustrating a semiconductor memory device including interlayer insulating layers according to some embodiments of the present invention.

FIG. 13 is a cross-sectional view illustrating a semiconductor memory device including interlayer insulating layers according to some embodiments of the present invention.

Referring to FIG. 13, an interlayer insulating layer 143 may include a first interlayer insulating layer 143*a*, a second interlayer insulating layer 143*b*, and a third interlayer insulating layer 143*c*. The first interlayer insulating layer 143*a* may be disposed in the second extension region R3 and the through region R4, and may cover the source layer 102. The second interlayer insulating layer 143*b* may be formed on the first interlayer insulating layer 143*a*. The second interlayer insulating layer 143*b* may be disposed in the second extension region R3 and the through region R4. The first interlayer insulating layer 143*a* and the second interlayer insulating layer 143*b* may be in contact with each other on a first contact surface CS1. Here, the first contact surface CS1 may be parallel to the top surface of the cell substrate 100.

The third interlayer insulating layer 143*c* may be formed in the cell array region R1, the first and second extension regions R2 and R3, and the through region R4. The third interlayer insulating layer 143*c* may be disposed on the first mold structure MS1 and the second interlayer insulating layer 143*b*. The second interlayer insulating layer 143*b* and the third interlayer insulating layer 143*c* may be in contact with each other on a second contact surface CS2. Here, the second contact surface CS2 may be parallel to the top surface of the cell substrate 100.

Impurity doping concentrations of the first interlayer insulating layer 143*a*, the second interlayer insulating layer 143*b*, and the third interlayer insulating layer 143*c* may be different from each other. For example, the impurity doping concentration of the first interlayer insulating layer 143*a* may be greater than the impurity doping concentration of the second interlayer insulating layer 143*b*, and the impurity doping concentration of the second interlayer insulating layer 143*b* may be greater than the impurity doping concentration of the third interlayer insulating layer 143*c*.

An interlayer insulating layer 148 may include a first interlayer insulating layer 148*a*, a second interlayer insulating layer 148*b*, and a third interlayer insulating layer 148*c*. The first interlayer insulating layer 148*a* may be disposed in the second extension region R3 and the through region R4, and may cover the interlayer insulating layer 143. The second interlayer insulating layer 148*b* may be formed on the first interlayer insulating layer 148*a*. The second interlayer insulating layer 148*b* may be disposed in the first extension region R2, the second extension region R3, and the through region R4. The first interlayer insulating layer 148*a* and the second interlayer insulating layer 148*b* may be in contact with each other on a third contact surface CS3. Here, the third contact surface CS3 may be parallel to the top surface of the cell substrate 100.

The third interlayer insulating layer 148*c* may be formed in the cell array region R1, the first and second extension regions R2 and R3, and the through region R4. The third interlayer insulating layer 148*c* may be disposed on the second mold structure MS2 and the second interlayer insulating layer 148*b*. The second interlayer insulating layer 148*b* and the third interlayer insulating layer 148*c* may be in contact with each other on a fourth contact surface CS4. Here, the fourth contact surface CS4 may be parallel to the top surface of the cell substrate 100.

Impurity doping concentrations of the first interlayer insulating layer 148*a*, the second interlayer insulating layer 148*b*, and the third interlayer insulating layer 148*c* may be different from each other. For example, the impurity doping concentration of the first interlayer insulating layer 148*a* may be greater than the impurity doping concentration of the second interlayer insulating layer 148*b*, and the impurity doping concentration of the second interlayer insulating layer 148*b* may be greater than the impurity doping concentration of the third interlayer insulating layer 148*c*.

Figure 14:
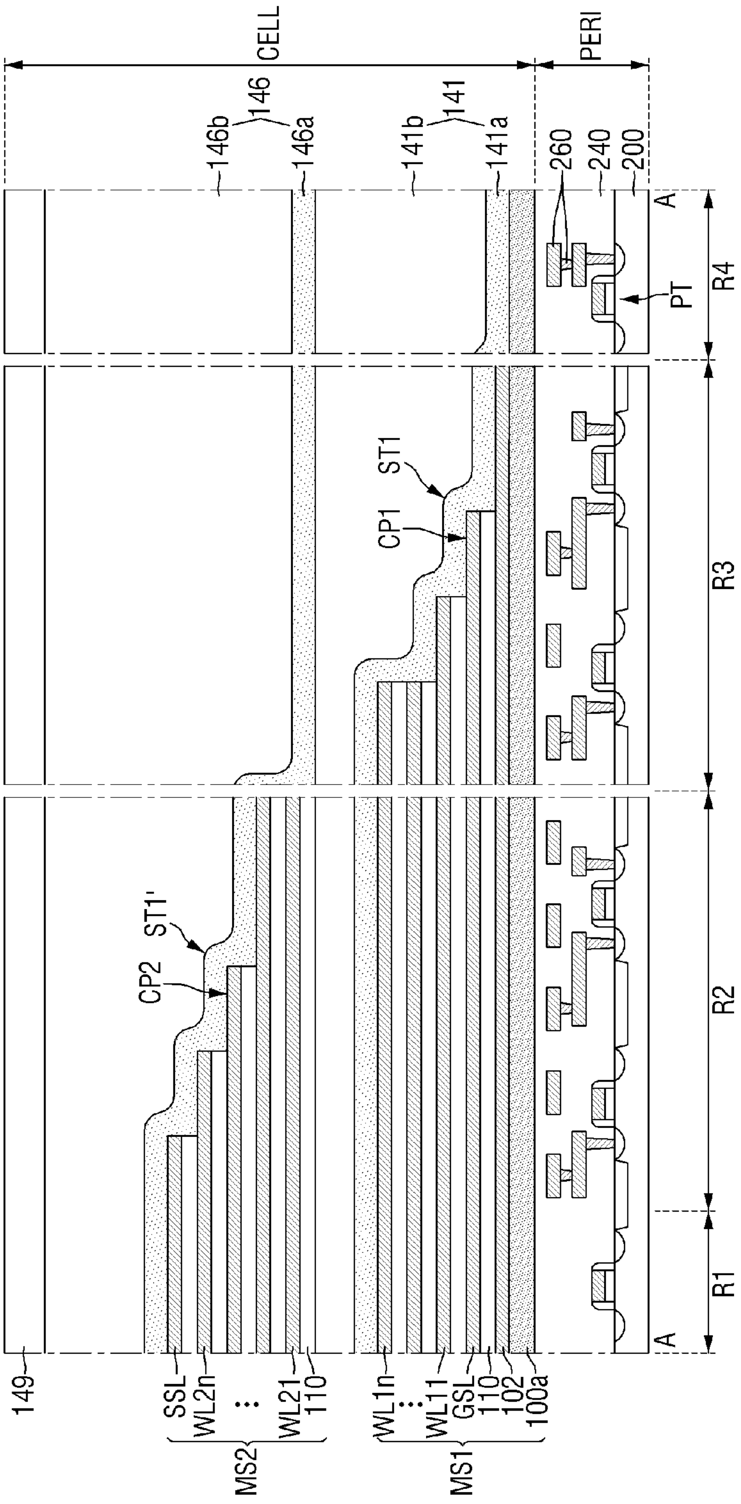
FIG. 14 is a cross-sectional view illustrating a semiconductor memory device including interlayer insulating layers according to some embodiments of the present invention.

FIG. 14 is a cross-sectional view illustrating a semiconductor memory device including interlayer insulating layers according to some embodiments of the present invention.

Referring to FIG. 14, an impurity doping concentration of a cell substrate 100*a* may be different from an impurity doping concentration of the interlayer insulating layer 141 and an impurity doping concentration of the interlayer insulating layer 146. For example, the impurity doping concentration of the cell substrate 100*a* may be greater than the impurity doping concentration of the interlayer insulating layer 141 and the impurity doping concentration of the interlayer insulating layer 146.

In addition, the impurity doping concentration of the cell substrate 100*a* may be greater than the impurity doping concentration of the first interlayer insulating layer 141*a* and the impurity doping concentration of the first interlayer insulating layer 146*a*. Accordingly, the first and second cell contact structures TCMC1 and TCMC2 and the first and second through vias TV1 and TV2 may be smoothly formed to penetrate through the cell substrate 100*a*.

Hereinafter, a semiconductor memory device 10 corresponding to a back-side vertical NAND (BVNAND) will be described with reference to FIG. 15.

Figure 15:
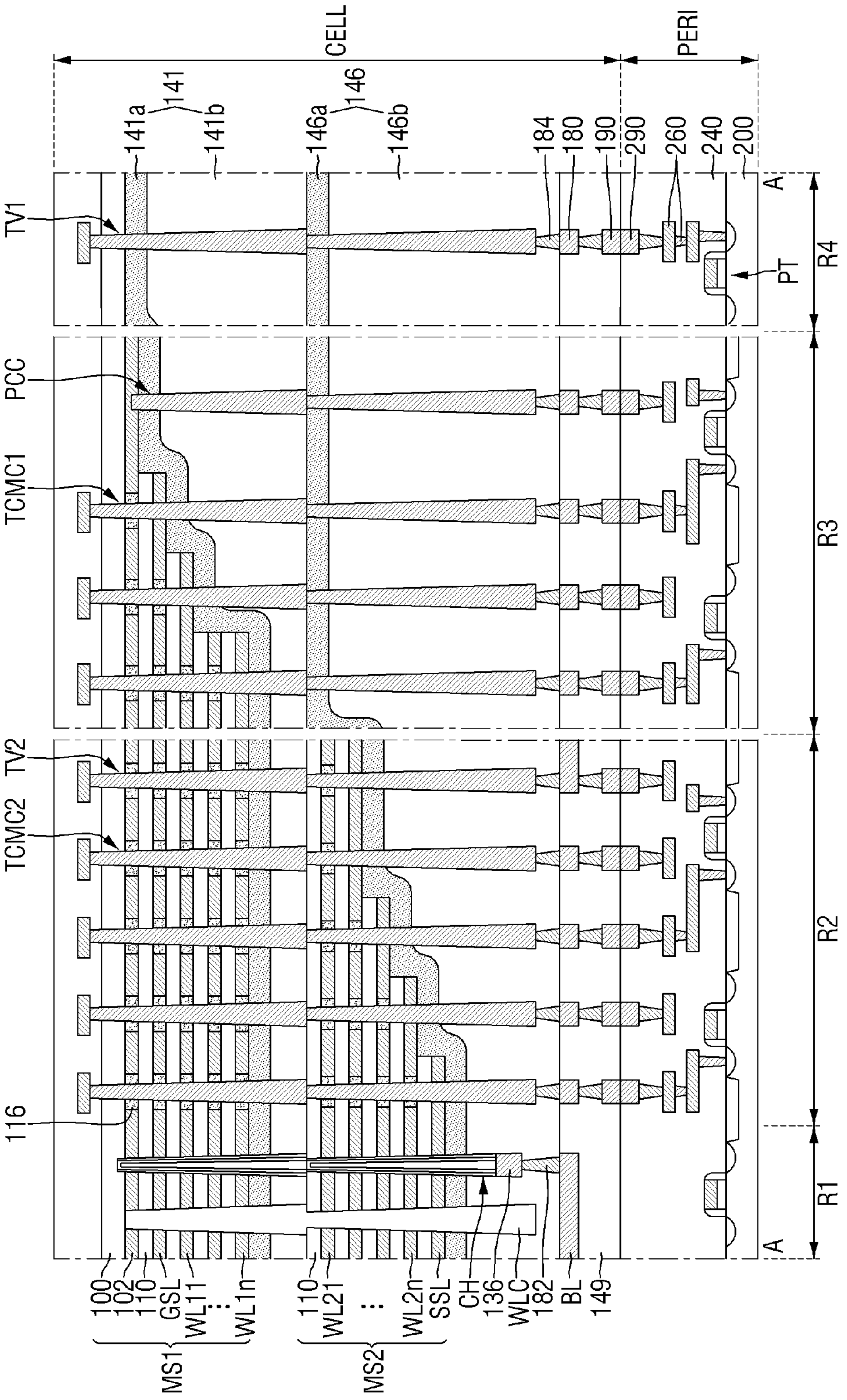
FIG. 15 is a cross-sectional view illustrating a semiconductor memory device according to some embodiments of the present invention.

FIG. 15 is a cross-sectional view illustrating a semiconductor memory device according to some embodiments of the present invention. For convenience of explanation, portions overlapping those described above with reference to FIGS. 1 to 14 will be briefly described or a description therefor will be omitted.

Referring to FIG. 15, the front side of the cell substrate 100 faces the front side of the peripheral circuit board 200.

For example, the semiconductor memory device 10 according to some embodiments of the present invention may have a chip to chip (C2C) structure. The C2C structure refers to a structure formed by fabricating an upper chip including the memory cell region CELL on a first wafer (e.g., the cell substrate 100), fabricating a lower chip including the peripheral circuit region PERI on a second wafer (e.g., the peripheral circuit board 200) different from the first wafer, and then connecting the upper chip and the lower chip to each other by a bonding method.

As an example, the bonding method may refer to a method of electrically connecting a first bonding metal 190 formed on the uppermost metal layer of the upper chip and a second bonding metal 290 formed on the uppermost metal layer of the lower chip to each other. For example, when the first bonding metal 190 and the second bonding metal 290 are formed of copper (Cu), the bonding method may be a Cu-Cu bonding method. However, this is only provided as an example, and the first bonding metal 190 and the second bonding metal 290 may be formed of various other metals such as aluminum (Al) or tungsten (W).

As the first bonding metal 190 and the second bonding metal 290 are connected, the first wiring structure 180 may be connected to the second wiring structure 260. As a result, each of the gate electrodes GSL, WL11 to WL1*n*, WL21 to WL2*n*, and SSL may be electrically connected to the peripheral circuit element PT.

Hereinafter, a semiconductor memory device 10 having three stacks will be described with reference to FIG. 16.

Figure 16:
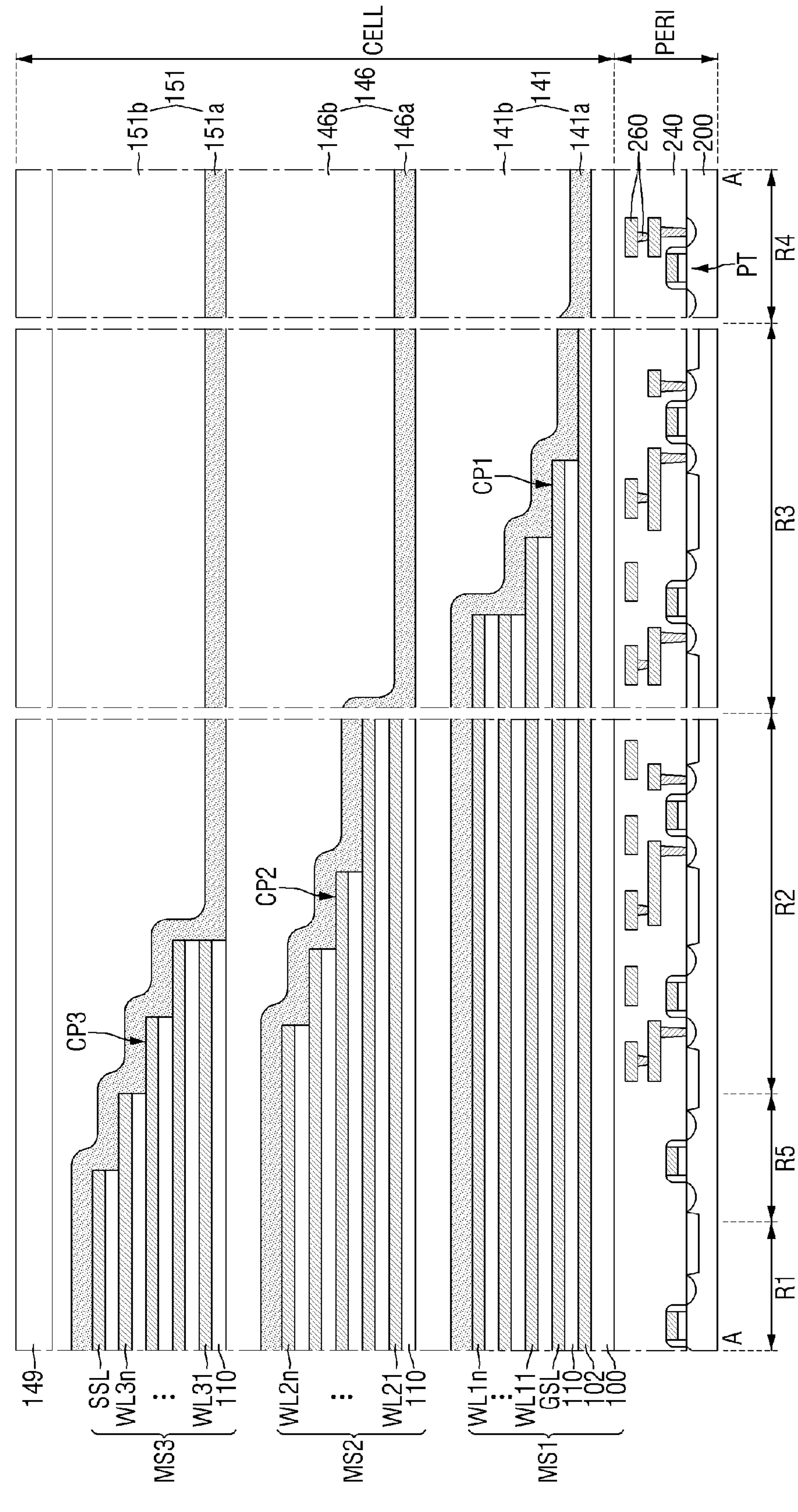
FIG. 16 is a cross-sectional view illustrating a semiconductor memory device according to some embodiments of the present invention.

FIG. 16 is a cross-sectional view illustrating a semiconductor memory device according to some embodiments of the present invention. For convenience of explanation, portions overlapping those described above with reference to FIGS. 1 to 14 will be briefly described or a description therefor will be omitted.

Referring to FIG. 16, the semiconductor memory device 10 may further include a third mold structure MS3.

The second mold structure MS2 may include the gate electrodes WL21 to WL2*n*.

The third mold structure MS3 may be stacked on the interlayer insulating layer 146. The third mold structure MS3 may include gate electrodes WL31 to WL3*n* and SSL and the mold insulating layers 110 interposed therebetween. Here, the gate electrodes WL31 to WL3*n* and SSL may be stacked in a step structure.

In the embodiment illustrated in FIG. 16, the cell substrate 100 may further include a third extension region R5. The third extension region R5 may correspond to between the cell array region R1 and the first extension region R2. The third mold structure MS3 may be formed in the cell array region R1 and the third expansion region R5. In addition, the third mold structure MS3 may have a step structure in the third extension region R5.

An interlayer insulating layer 151 may be formed on the interlayer insulating layer 146 and the third mold structure MS3. The interlayer insulating layer 151 may be formed in the cell array region R1, the first to third extension regions R2, R3, and R5, and the through region R4. The interlayer insulating layer 151 may include a first interlayer insulating layer 151*a* and a second interlayer insulating layer 151*b*. Here, an impurity doping concentration of the first interlayer insulating layer 151*a* and an impurity doping concentration of the second interlayer insulating layer 151*b* may be different from each other. For example, the impurity doping concentration of the first interlayer insulating layer 151*a* may be greater than the impurity doping concentration of the second interlayer insulating layer 151*b*.

In some embodiments of the present disclosure, an impurity doping concentration of the interlayer insulating layer 141, an impurity doping concentration of the interlayer insulating layer 146, and an impurity doping concentration of the interlayer insulating layer 151 may be different from each other. For example, the impurity doping concentration of the first interlayer insulating layer 141*a*, the impurity doping concentration of the first interlayer insulating layer 146*a*, and the impurity doping concentration of the first interlayer insulating layer 151*a* may be different from each other. For example, the impurity doping concentration of the first interlayer insulating layer 141*a* may be greater than the impurity doping concentration of the first interlayer insulating layer 146*a*, and the impurity doping concentration of the first interlayer insulating layer 146*a* may be greater than the impurity doping concentration of the first interlayer insulating layer 151*a*. Accordingly, the three-stack semiconductor memory device including the interlayer insulating layers having different impurity doping concentrations may be provided.

Hereinafter, the semiconductor memory device 10 having 19 holes will be described with reference to FIGS. 17 and 18.

Figure 17:
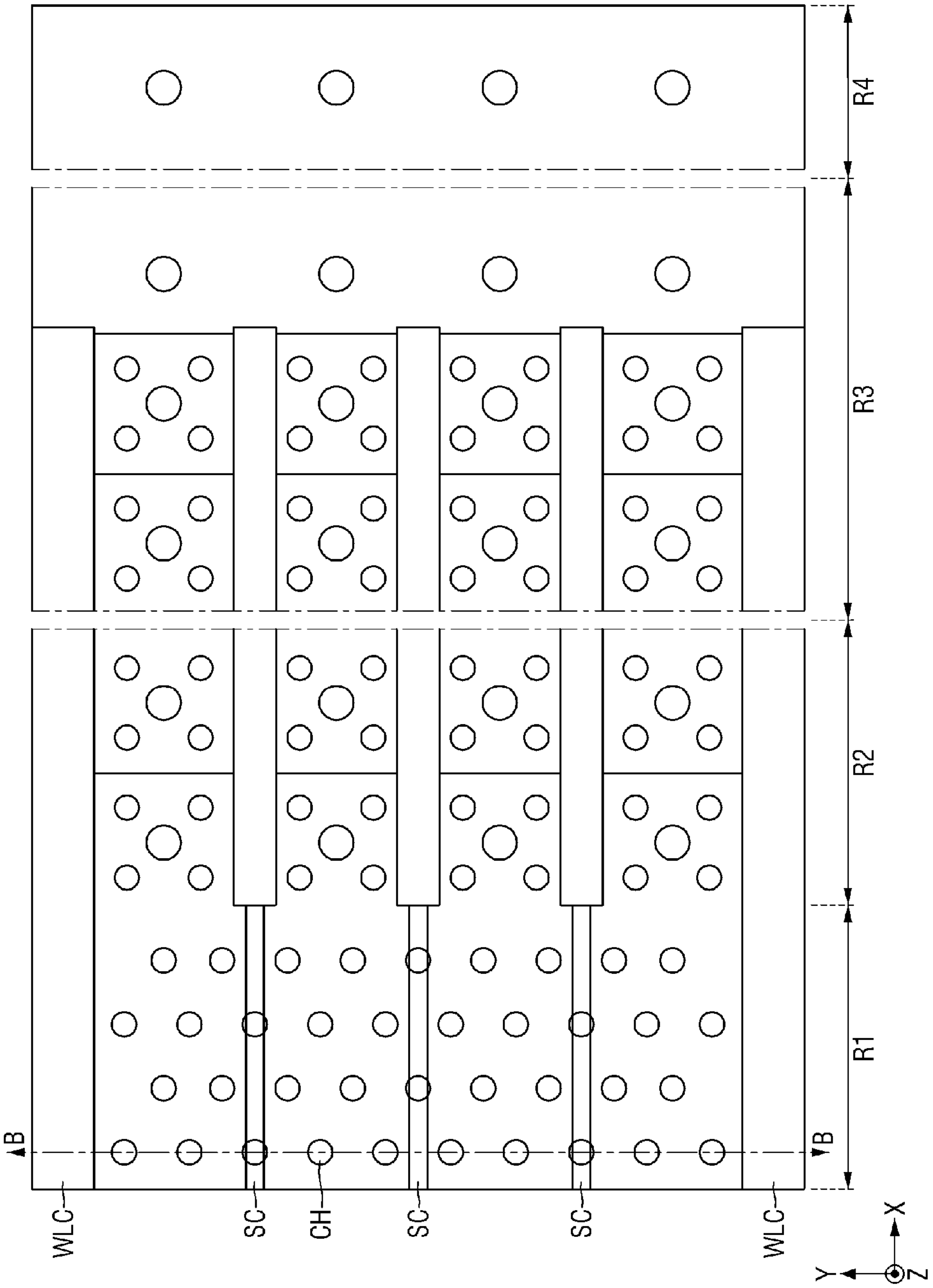
FIG. 17 is a layout diagram illustrating a semiconductor memory device according to some embodiments of the present invention.

FIG. 17 is a layout diagram illustrating a semiconductor memory device according to some embodiments of the present invention. FIG. 18 is a cross-sectional view taken along line B-B of FIG. 17. For convenience of explanation, portions overlapping those described above with reference to FIGS. 1 to 14 will be briefly described or a description therefor will be omitted.

Figure 18:
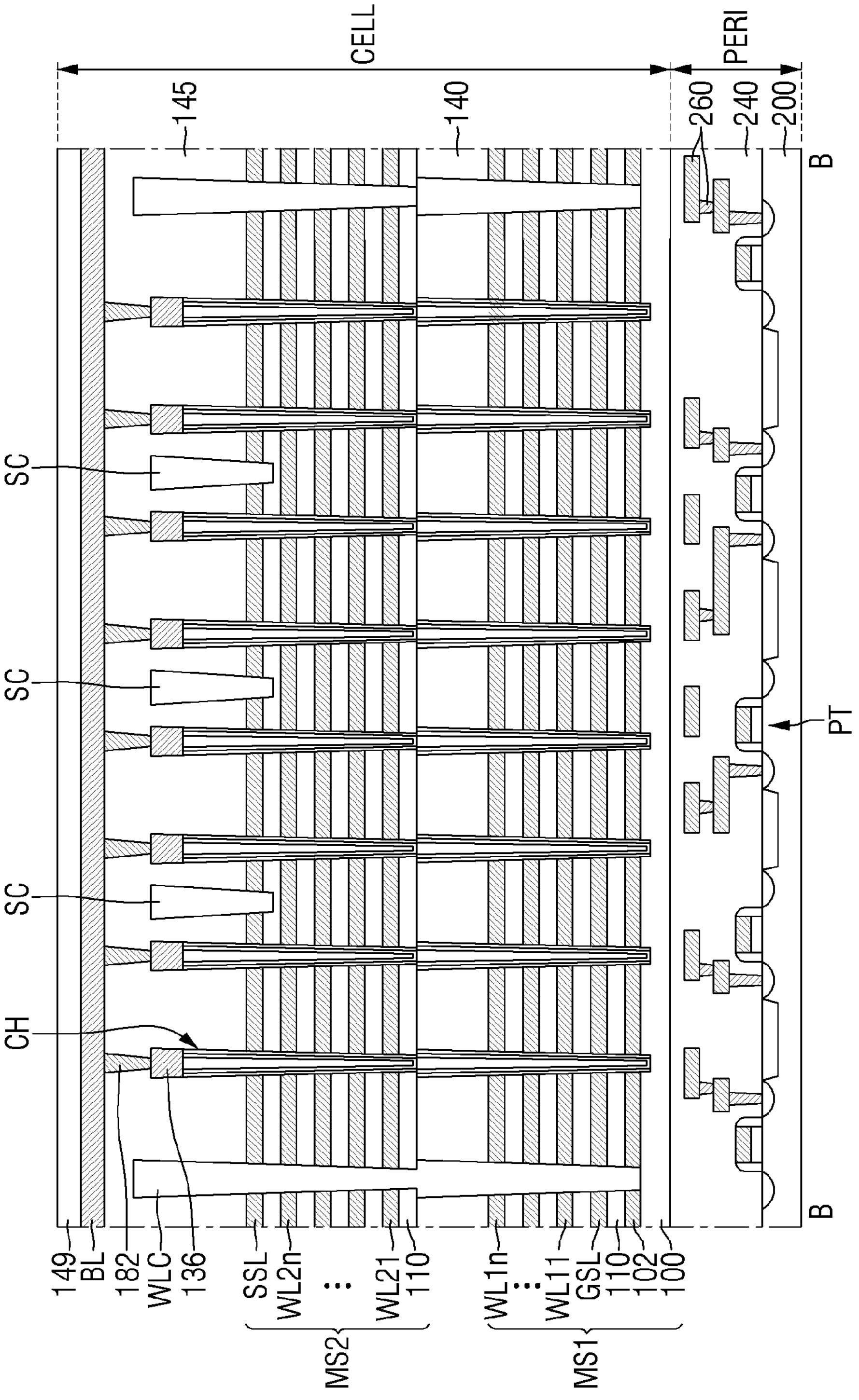
FIG. 18 is a cross-sectional view taken along line B-B of FIG. 17.

Referring to FIGS. 17 and 18, the semiconductor memory device according to some embodiments of the present invention may have 19 channel structures CH between the word line cut regions WLC. Here, the 19 channel structures CH may be arranged in a zigzag shape in the second direction Y.

In the embodiment illustrated in FIGS. 17 and 18, the semiconductor memory device 10 may include three string separation structures SC between the word line cut regions WLC. That is, the memory block may be separated by the three string separation structures SC.

Hereinafter, a fabricating method of the semiconductor memory device 10 will be described with reference to FIGS. 19 to 27.

FIGS. 19 to 27 are drawings illustrating a fabricating method of a semiconductor memory device according to some embodiments of the present invention. For convenience of explanation, portions overlapping those described above with reference to FIGS. 1 to 18 will be briefly described or a description therefor will be omitted.

Figure 19:
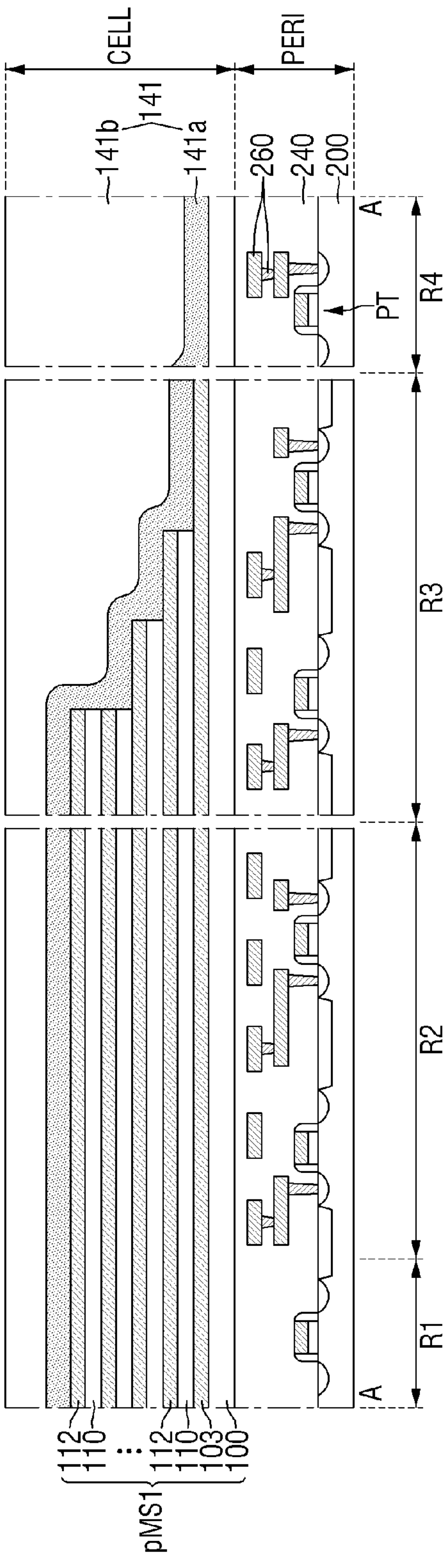
FIGS. 19 to 27 are intermediate step drawings illustrating a fabricating method of a semiconductor memory device according to some embodiments of the present invention.

Referring to FIG. 19, a first preliminary mold pMS1 and an interlayer insulating layer 141 are formed on the cell substrate 100.

The first preliminary mold pMS1 may be formed on a front side of the cell substrate 100. The first preliminary mold pMS1 may include a plurality of mold sacrificial layers 112 and a plurality of mold insulating layers 110 that are alternately stacked on the cell substrate. The mold sacrificial layers 112 may be patterned in a step shape in the second extension region R3. The mold sacrificial layer 112 may include a material having an etch selectivity with respect to the mold insulating layer 110. For example, the mold insulating layer 110 may include silicon oxide, and the mold sacrificial layer 112 may include silicon nitride.

The cell substrate 100 may be stacked on a peripheral circuit region PERI. In addition, a peripheral circuit element PT, a second wiring structure 260, and a second inter-wiring insulating layer 240 may be formed on the peripheral circuit board 200.

Subsequently, an interlayer insulating layer 141 may be formed on the cell substrate 100, the source sacrificial layer 103, and the first preliminary mold pMS1. The first interlayer insulating layer 141*a* may be conformally formed along the cell substrate 100, the source sacrificial layer 103, and the first preliminary mold pMS1. In addition, a second interlayer insulating layer 141*b* may be formed on the first interlayer insulating layer 141*a*. Here, the first interlayer insulating layer 141*a* and the second interlayer insulating layer 141*b* may be doped with impurities. In addition, an impurity doping concentration of the first interlayer insulating layer 141*a* may be greater than an impurity doping concentration of the second interlayer insulating layer 141*b*.

Figure 20:
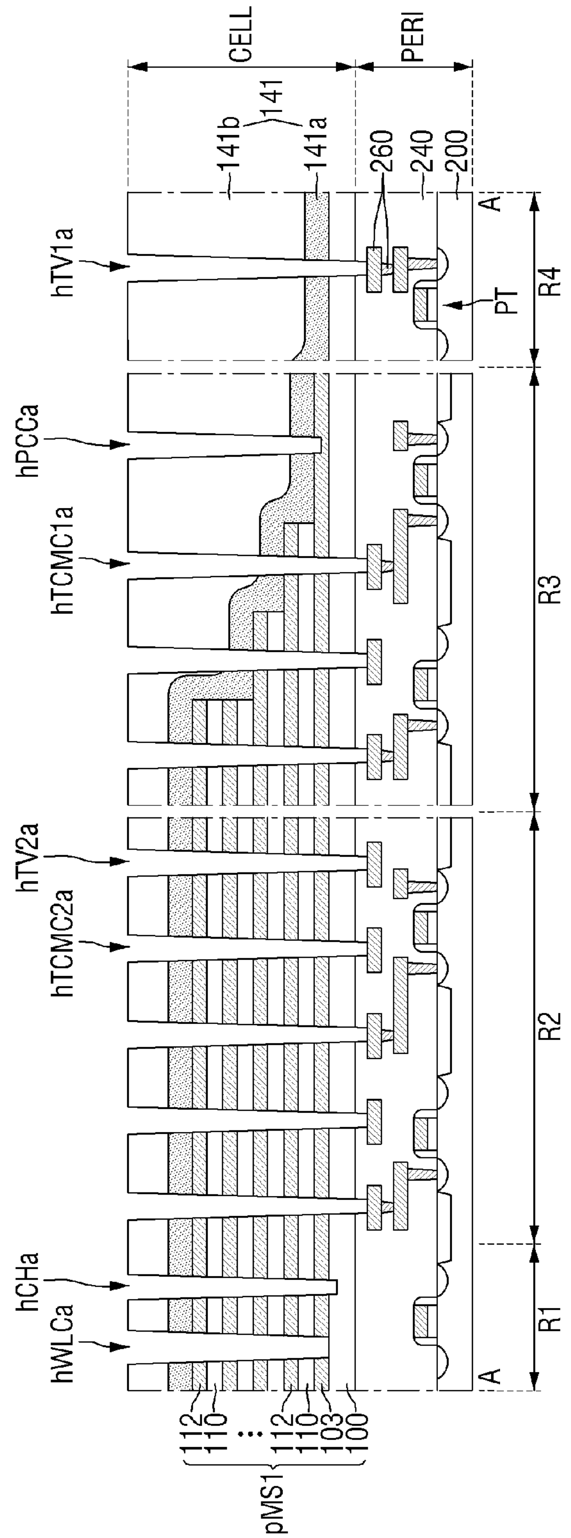

Referring to FIG. 20, a word line cut region hole hWLCa, a channel structure hole hCHa, a first cell contact structure hole hTCMC1*a*, a second cell contact structure hole hTCMC2*a*, a first through via hole hTV1*a*, a second through via hole hTV2*a*, and a common source line contact hole hPCCa may be formed in the first preliminary mold pMS1 and the interlayer insulating layer 141. In this case, the word line cut region hole hWLCa, the channel structure hole hCHa, the first cell contact structure hole hTCMC1*a*, the second cell contact structure hole hTCMC2*a*, the first through via hole hTV1*a*, the second through via hole hTV2*a*, and the common source line contact hole hPCCa may be simultaneously formed by HARC merge etching.

The word line cut region hole hWLCa, the channel structure hole hCHa, the first cell contact structure hole hTCMC1*a*, the second cell contact structure hole hTCMC2*a*, the first through via hole hTV1*a*, the second through via hole hTV2*a*, and the common source line contact hole hPCCa having different lengths may be formed by the first and second interlayer insulating layers 141*a* and 141*b* having different impurity doping concentrations. That is, the etching ratio of the first preliminary mold pMS1 and the interlayer insulating layer 141 may be adjusted.

Figure 21:
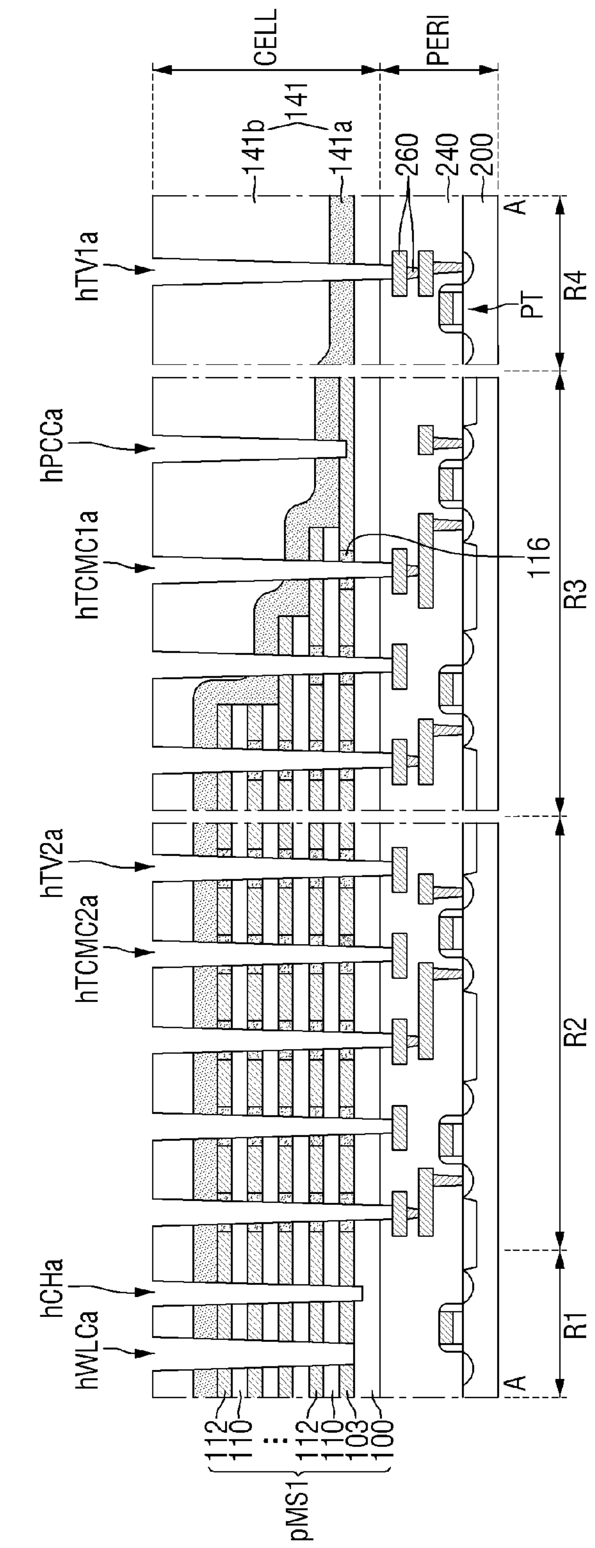

Referring to FIG. 21, an insulating ring 116 may be formed between the first preliminary mold pMS1 and the through vias. In addition, an insulating ring 116 may be formed between the source sacrificial layer 103 and the through vias. Accordingly, each of the first preliminary mold pMS1 and the through vias may be separated or insulated.

Figure 22:
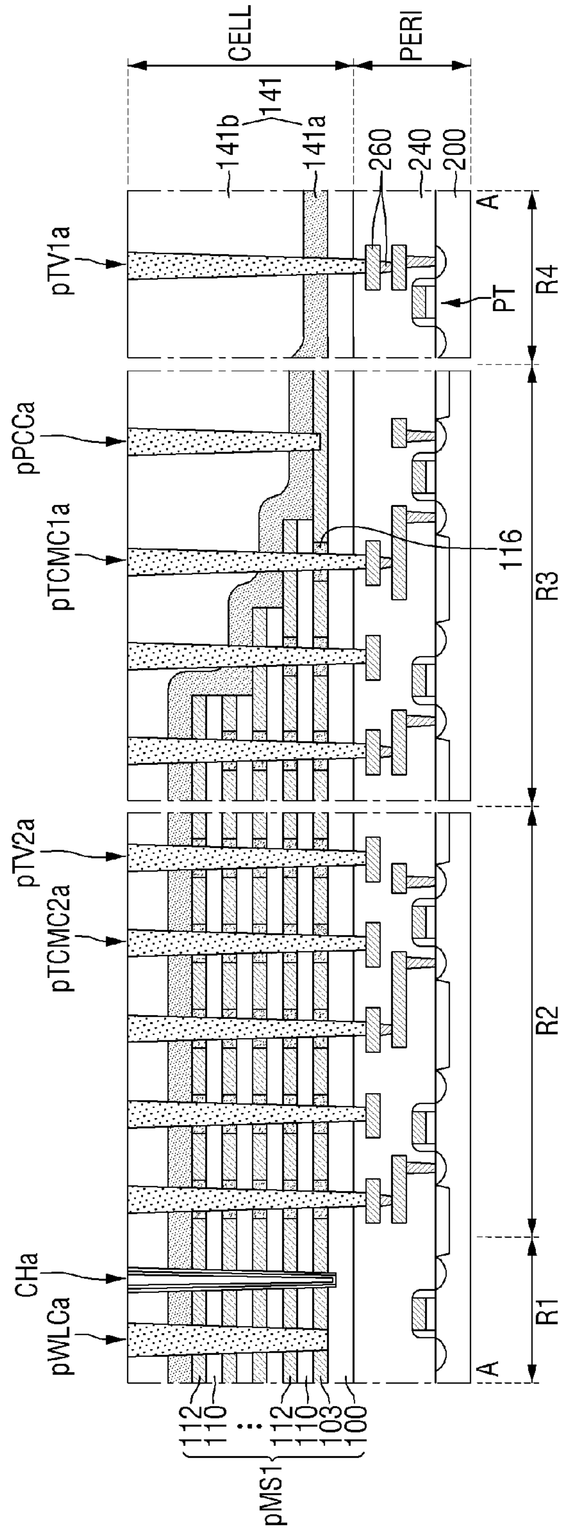

Referring to FIG. 22, a preliminary word line cut region pWLCa, a first preliminary cell contact structure pTCMC1*a*, a second preliminary cell contact structure pTCMC2*a*, a first preliminary through via pTV1*a*, a second preliminary through via pTV2*a*, and a preliminary common source line contact pPCCa may be formed. Here, each of the preliminary word line cut region pWLCa, the first preliminary cell contact structure pTCMC1*a*, the second preliminary cell contact structure pTCMC2*a*, the first preliminary through via pTV1*a*, the second preliminary through via pTV2*a*, and the preliminary common source line contact pPCCa may be formed in each of the word line cut region hole hWLCa, the first cell contact structure hole hTCMC1*a*, the second cell contact structure hole hTCMC2*a*, the first through via hole hTV1*a*, the second through via hole hTV2*a*, and the common source line contact hole hPCCa. Here, the preliminary word line cut region pWLCa, the first preliminary cell contact structure pTCMC1*a*, the second preliminary cell contact structure pTCMC2*a*, the first preliminary through via pTV1*a*, the second preliminary through via pTV2*a*, and the preliminary common source line contact pPCCa may include a material having an etch selectivity with respect to the mold insulating layer 110 and the mold sacrificial layer 112, and may include, for example, polysilicon.

In addition, the channel structure CHa may be formed.

Figure 23:
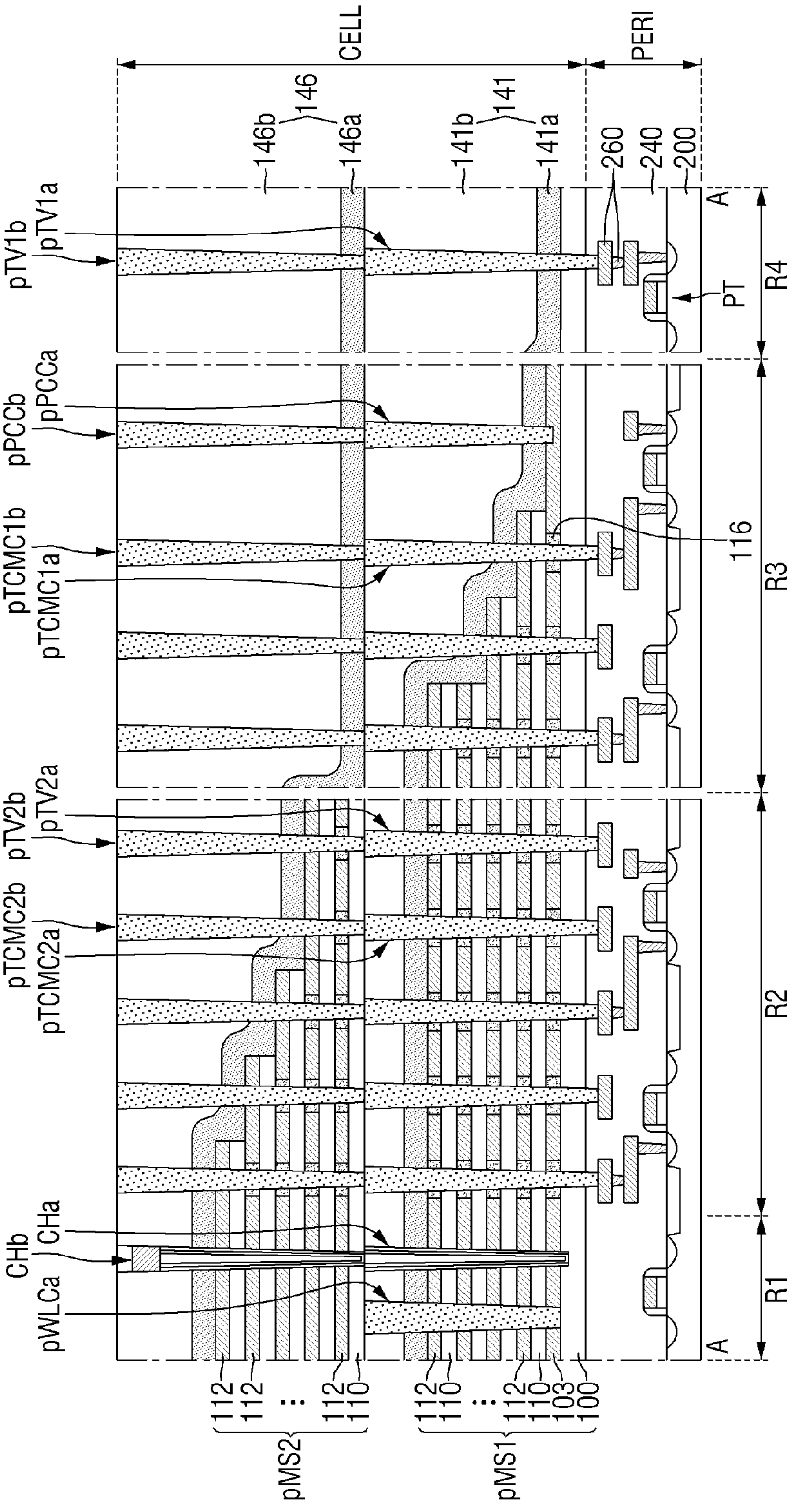

Referring to FIG. 23, a second preliminary mold pMS2, an interlayer insulating layer 146, a first preliminary cell contact structure pTCMC1*b*, a second preliminary cell contact structure pTCMC2*b*, a first preliminary through via pTV1*b*, a second preliminary through via pTV2*b*, a preliminary common source line contact pPCCb, and a channel structure Cha may be formed.

The first preliminary cell contact structure pTCMC1*b*, the second preliminary cell contact structure pTCMC2*b*, the first preliminary through via pTV1*b*, the second preliminary through via pTV2*b*, the preliminary common source line contact pPCCb, and the channel structure Chb may be connected to the first preliminary cell contact structure pTCMC1*a*, the second preliminary cell contact structure pTCMC2*a*, the first preliminary through via pTV1*a*, the second preliminary through via pTV2*a*, the preliminary common source line contact pPCCa, and the channel structure CHa.

Here, the first interlayer insulating layer 146*a* may be conformally formed along the second preliminary mold pMS2. In addition, the second interlayer insulating layer 146*b* may be formed on the first interlayer insulating layer. An impurity doping concentration of the first interlayer insulating layer 146*a* may be different from an impurity doping concentration of the second interlayer insulating layer 146*b*.

Figure 24:
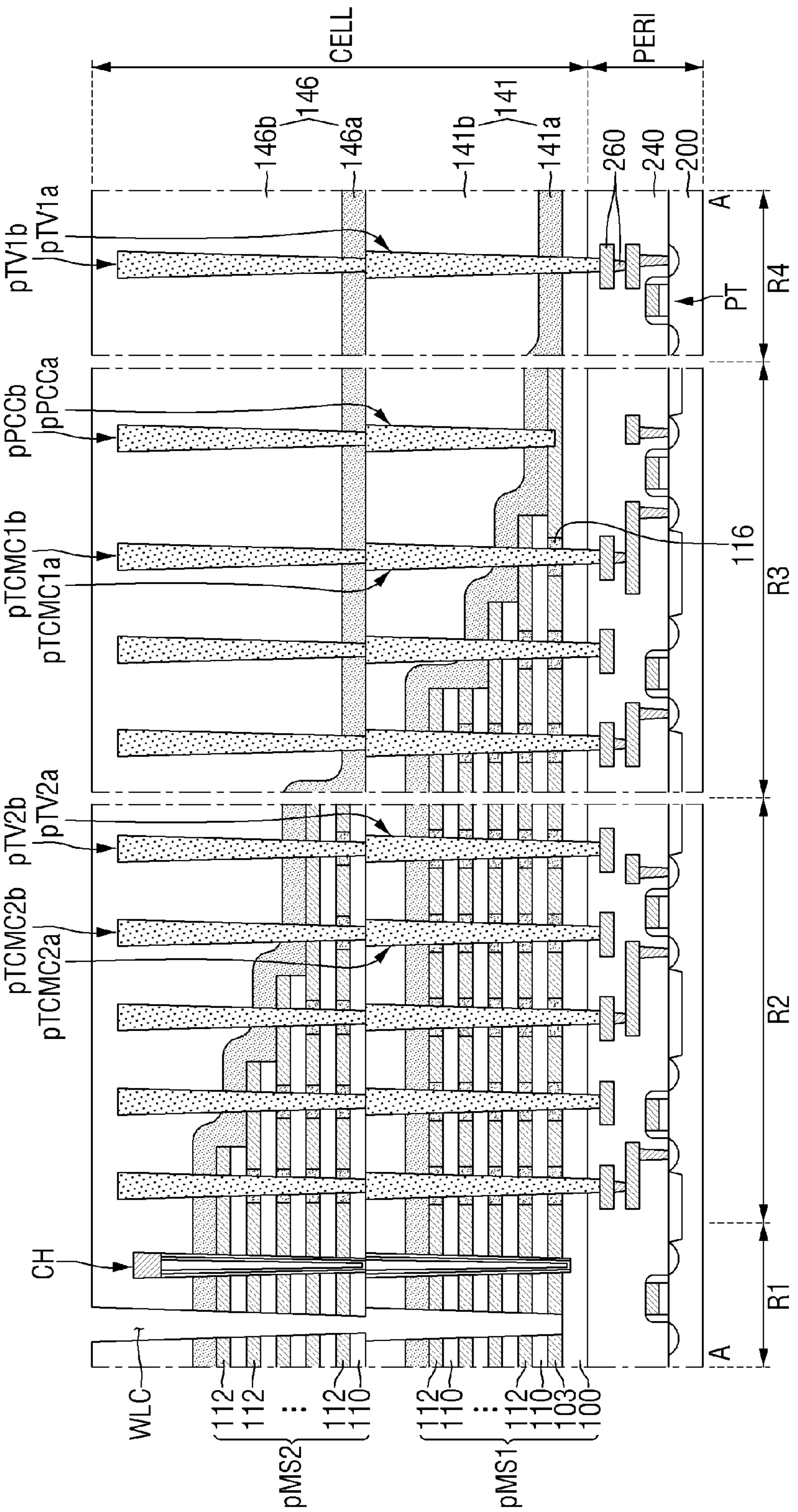

Referring to FIG. 24, a word line cut region WLC may be formed. The word line cut region WLC may extend in the first direction X to cut the first and second preliminary molds pMS1 and pMS2.

Figure 25:
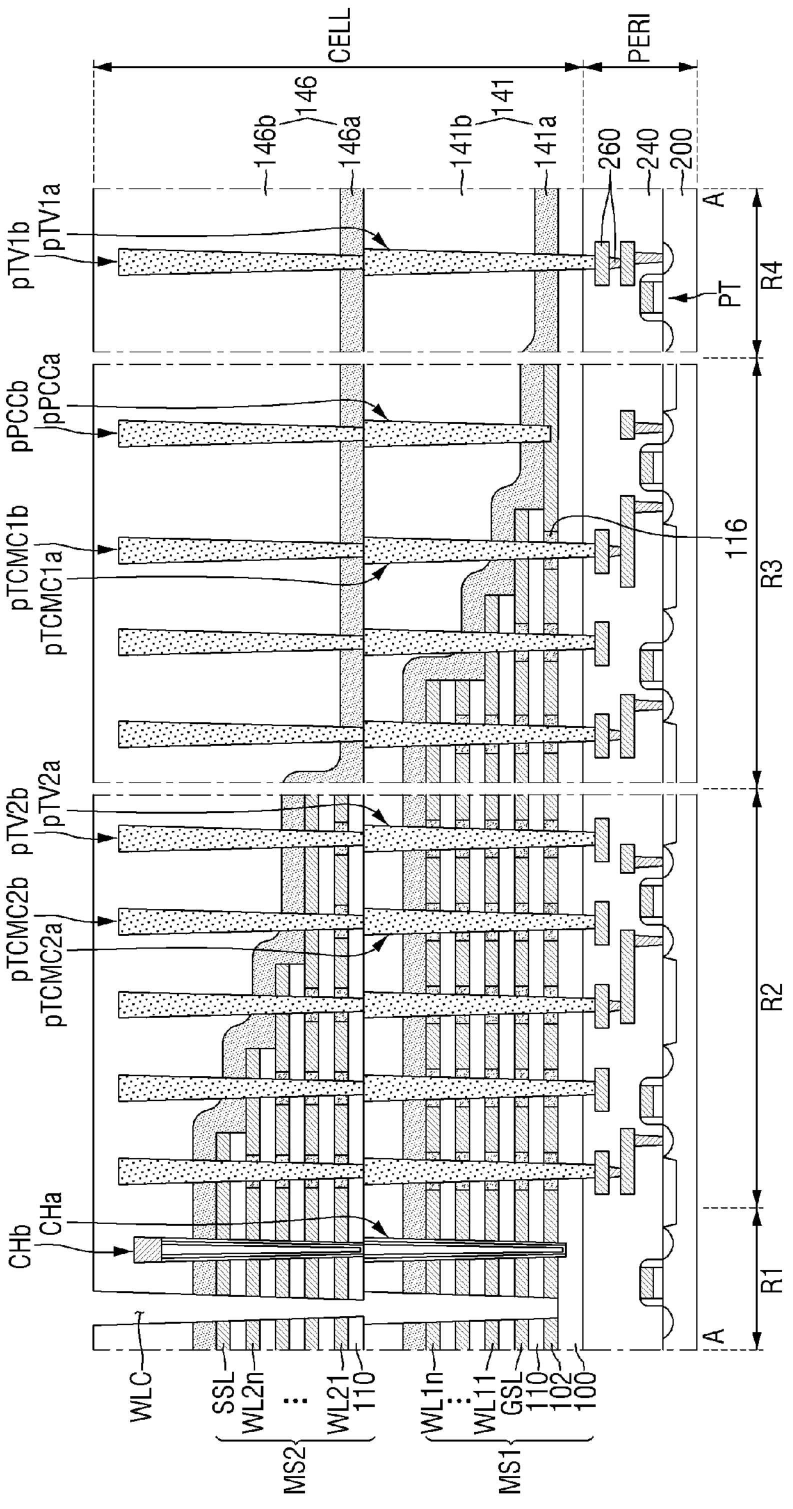

Referring to FIG. 25, a plurality of gate electrodes GSL, WL11 to WL1*n*, WL21 to WL2*n*, and SSL may be formed.

For example, the mold sacrificial layers 112 may be removed using the word line cut region WLC. The mold sacrificial layers 112 have an etch selectivity with respect to the mold insulating layers 110, and thus may be selectively removed. Subsequently, gate electrodes GSL, WL11 to WL1*n*, WL21 to WL2*n*, and SSL may be formed to replace the regions from which the mold sacrificial layers 112 are removed. As a result, a first mold structure MS1 including a plurality of first gate electrodes GSL and WL11 to WL1*n* and a second mold structure MS2 including a plurality of second gate electrodes WL21 to WL2*n* and SSL may be formed. After the first mold structure MS1 and the second mold structure MS2 are formed, the word line cut region WLC may be filled with an insulating material.

Figure 26:
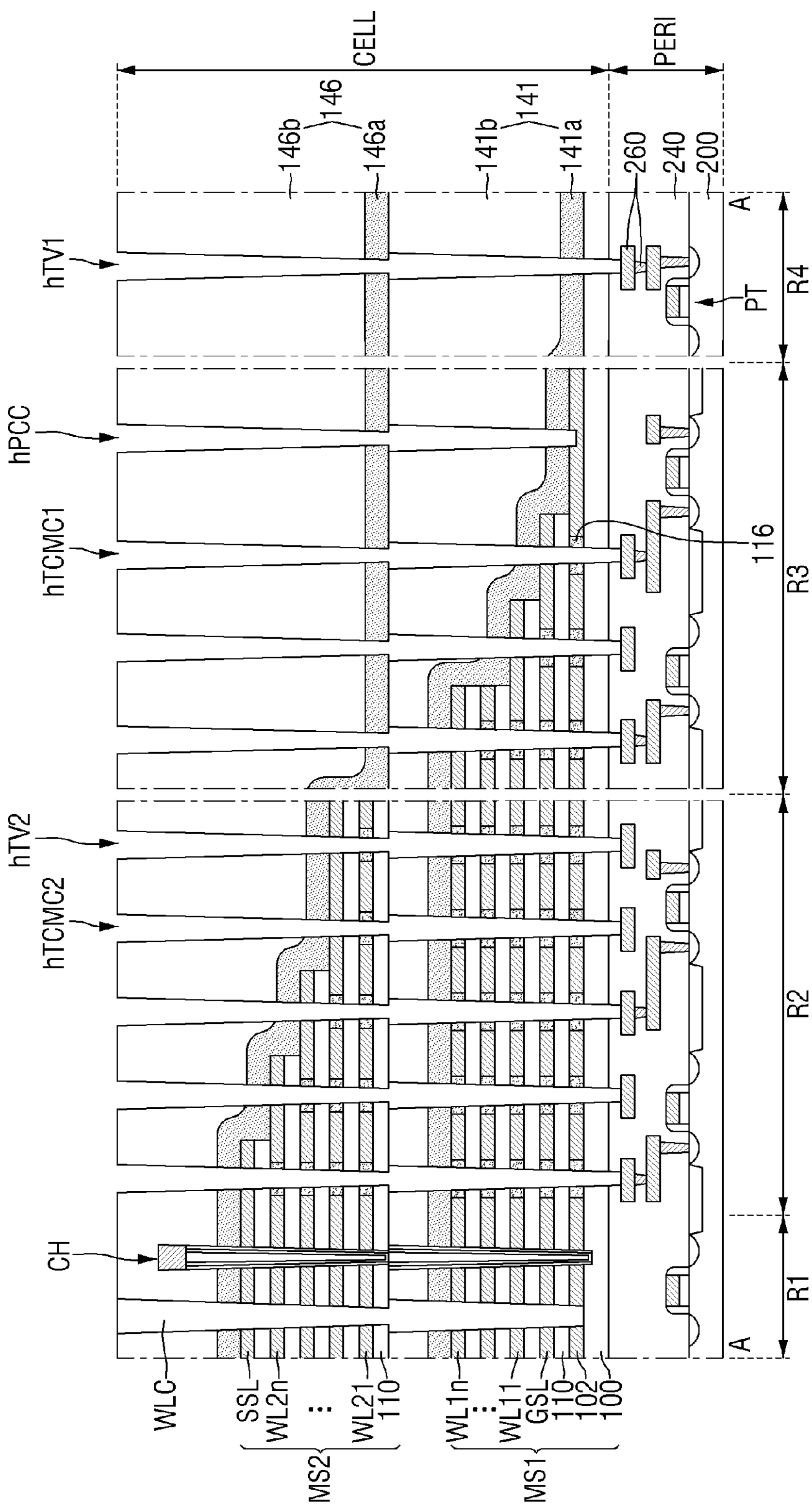

Referring to FIG. 26, a first cell contact structure hole hTCMC1, a second cell contact structure hole hTCMC2, a first through via hole hTV1, a second through via hole hTV2, and a common source line contact hole hPCC may be formed.

For example, the first preliminary cell contact structure pTCMC1*a*, the second preliminary cell contact structure pTCMC2*a*, the first preliminary through via pTV1*a*, the second preliminary through via pTV2*a*, the preliminary common source line contact pPCCa, the first preliminary cell contact structure pTCMC1*b*, the second preliminary cell contact structure pTCMC2*b*, the first preliminary through via pTV1*b*, the second preliminary through via pTV2*b*, and the preliminary common source line contact pPCCb may be selectively removed.

Figure 27:
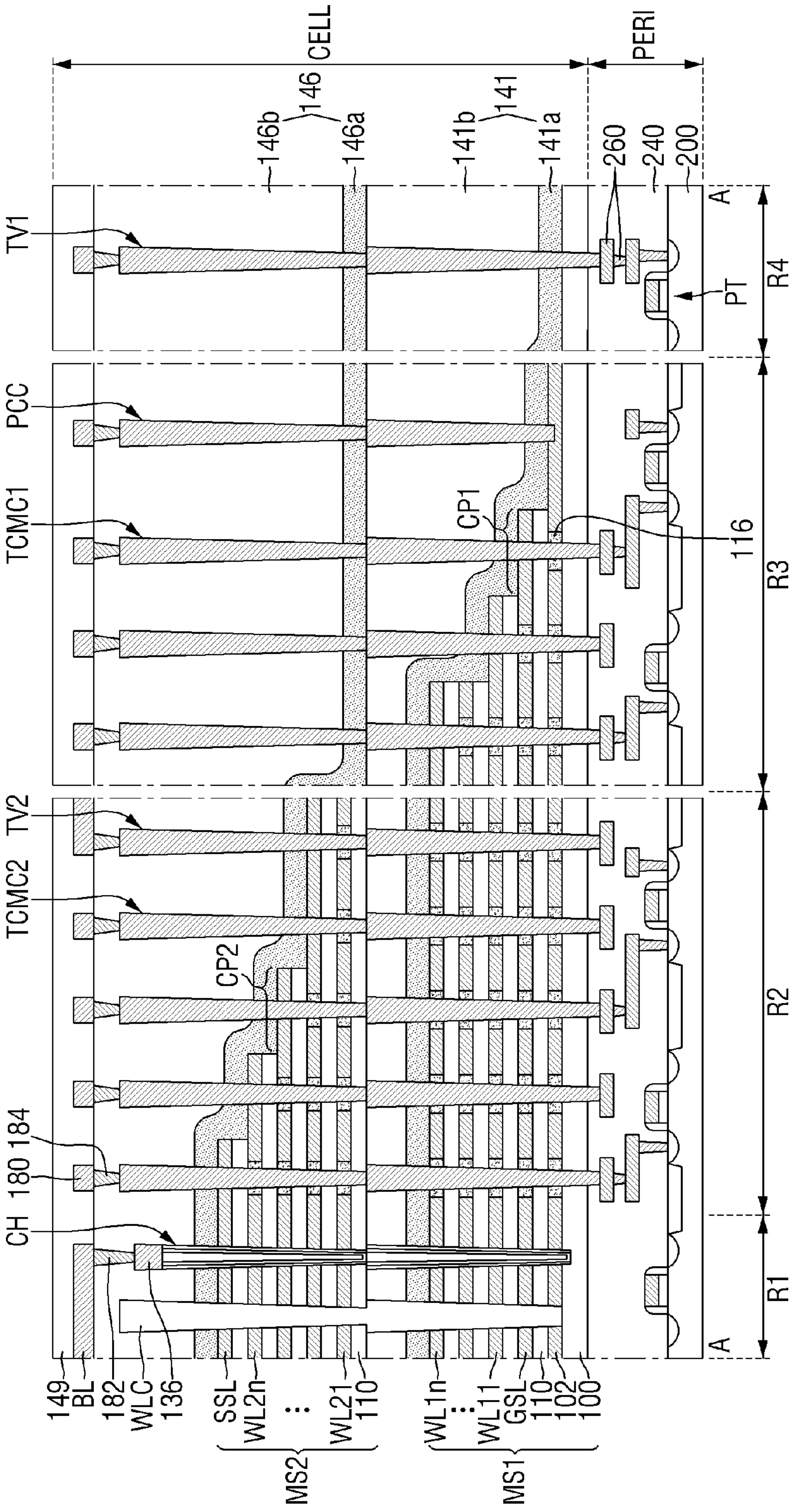

Referring to FIG. 27, the first cell contact structure TCMC1, the second cell contact structure TCMC2, the first through via TV1, the second through via TV2, and the common source line contact PCC may be formed in the first cell contact structure hole hTCMC1, the second cell contact structure hole hTCMC2, the first through via hole hTV1, the second through via hole hTV2, and the common source line contact hole hPCC.

Hereinafter, an electronic system 1000 including the semiconductor memory device 10 according to some embodiments of the present invention will be described with reference to FIGS. 28 to 30.

Figure 28:
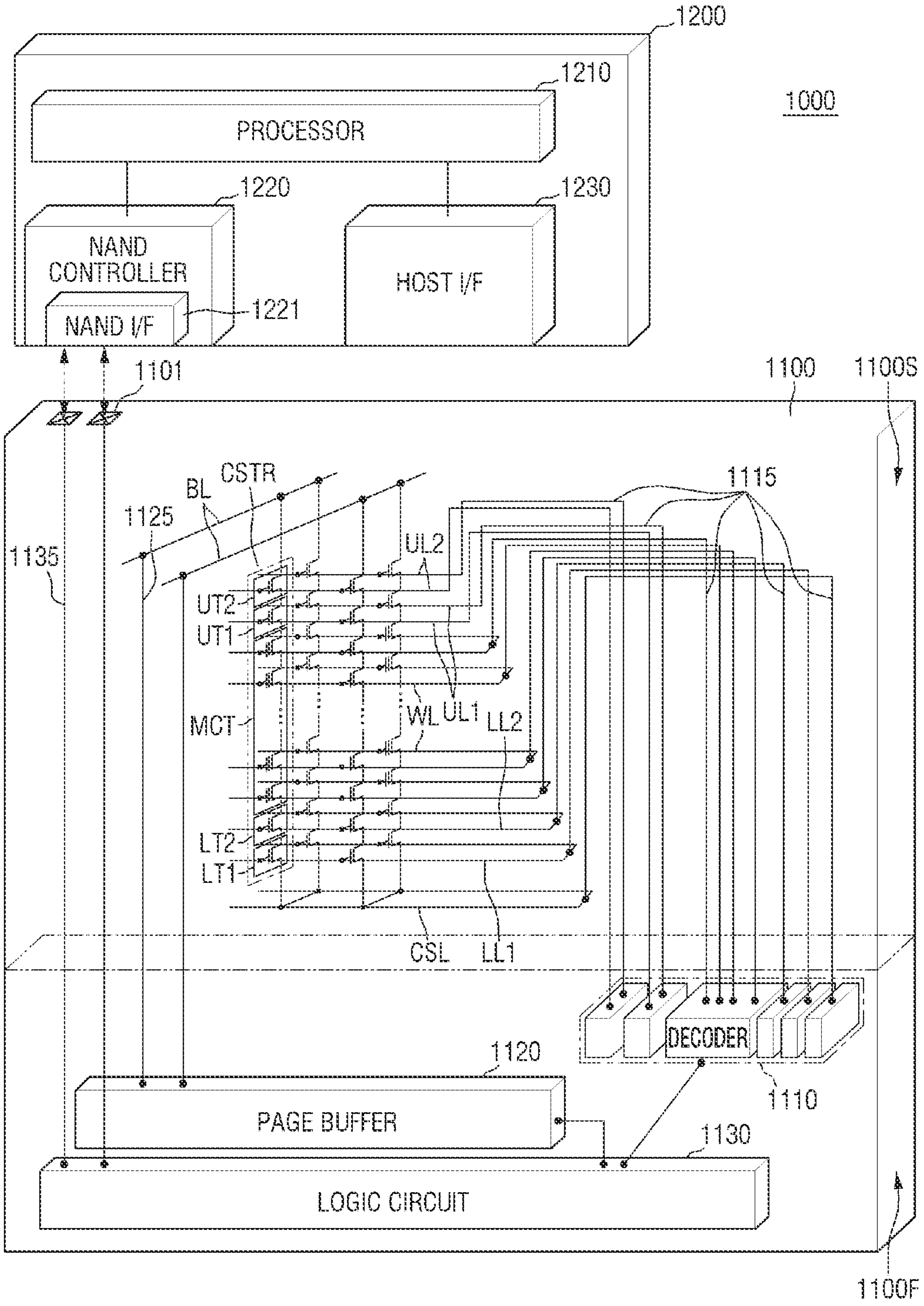
FIG. 28 is a block diagram illustrating an electronic system according to some embodiments of the present invention.

FIG. 28 is a block diagram illustrating an electronic system according to some embodiments of the present invention. FIG. 29 is a perspective view illustrating an electronic system according to some embodiments of the present invention. FIG. 30 is a schematic cross-sectional view taken along line I-I of FIG. 29.

Referring to FIG. 28, an electronic system 1000 according to some embodiments of the present invention may include a semiconductor memory device 1100 and a controller 1200 electrically connected to the semiconductor memory device 1100. The electronic system 1000 may be a storage device including one semiconductor memory device 1100 or a plurality of semiconductor memory devices 1100 or an electronic device including the storage device. For example, the electronic system 1000 may be a solid state drive (SSD) device, a universal serial bus (USB), a computing system, a medical device, or a communication device including one semiconductor memory device 1100 or a plurality of semiconductor memory devices 1100.

The semiconductor memory device 1100 may be a non-volatile memory device (e.g., a NAND flash memory device), for example, the semiconductor memory device described above with reference to FIGS. 1 to 13. The semiconductor memory device 1100 may include a first structure 1100F and a second structure 1100S on the first structure 1100F.

The first structure 1100F may be a peripheral circuit structure including a decoder circuit 1110 (e.g., the row decoder 33 in FIG. 1), a page buffer 1120 (e.g., the page buffer 35 in FIG. 1), and a logic circuit 1130 (e.g., the control logic 37 in FIG. 1).

The second structure 1100S may include the common source line CSL, the plurality of bit lines BL, and the plurality of cell strings CSTR described above with reference to FIG. 2. The cell strings CSTR may be connected to the decoder circuit 1110 through the word line WL, at least one string select line SSL, and at least one ground select line GSL. In addition, the cell strings CSTR may be connected to the page buffer 1120 through the bit lines BL.

In some embodiments, the common source line CSL and the cell strings CSTR may be electrically connected to the decoder circuit 1110 through first connection wirings 1115 extending from the first structure 1100F to the second structure 1100S. The first connection wiring 1115 may correspond to the first through via TV1 or the second through via TV2 described above with reference to FIGS. 1 to 13. That is, the first through via TV1 or the second through via TV2 may electrically connect each of the gate electrodes GSL, WL, and SSL to the decoder circuit 1110 (e.g., the row decoder 33 of FIG. 1).

In some embodiments, the bit lines BL may be electrically connected to the page buffer 1120 through second connection wirings 1125 extending from the first structure 110F to the second structure 1100S. The second connection wiring 1125 may correspond to the first through via TV1 or the second through via TV2 described above with reference to FIGS. 1 to 13. That is, the first through via TV1 or the second through via TV2 may electrically connect the bit lines BL and the page buffer 1120 (e.g., the page buffer 35 of FIG. 1).

The semiconductor memory device 1100 may communicate with the controller 1200 through an input/output pad 1101 electrically connected to the logic circuit 1130 (e.g., the control logic 37 of FIG. 1). The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control an overall operation of the electronic system 1000 including the controller 1200. The processor 1210 may operate according to predetermined firmware, and may access the semiconductor memory device 1100 by controlling the NAND controller 1220. The NAND controller 1220 may include a NAND interface 1221 processing communication with the semiconductor memory device 1100. A control command for controlling the semiconductor memory device 1100, data to be written to the memory cell transistors MCT of the semiconductor memory device 1100, data to be read from the memory cell transistors MCT of the semiconductor memory device 1100, and the like, may be transmitted through the NAND interface 1221. The host interface 1230 may provide a communication function between the electronic system 1000 and an external host. When a control command is received from the external host through the host interface 1230, the processor 1210 may control the semiconductor memory device 1100 in response to the control command.

Figure 29:
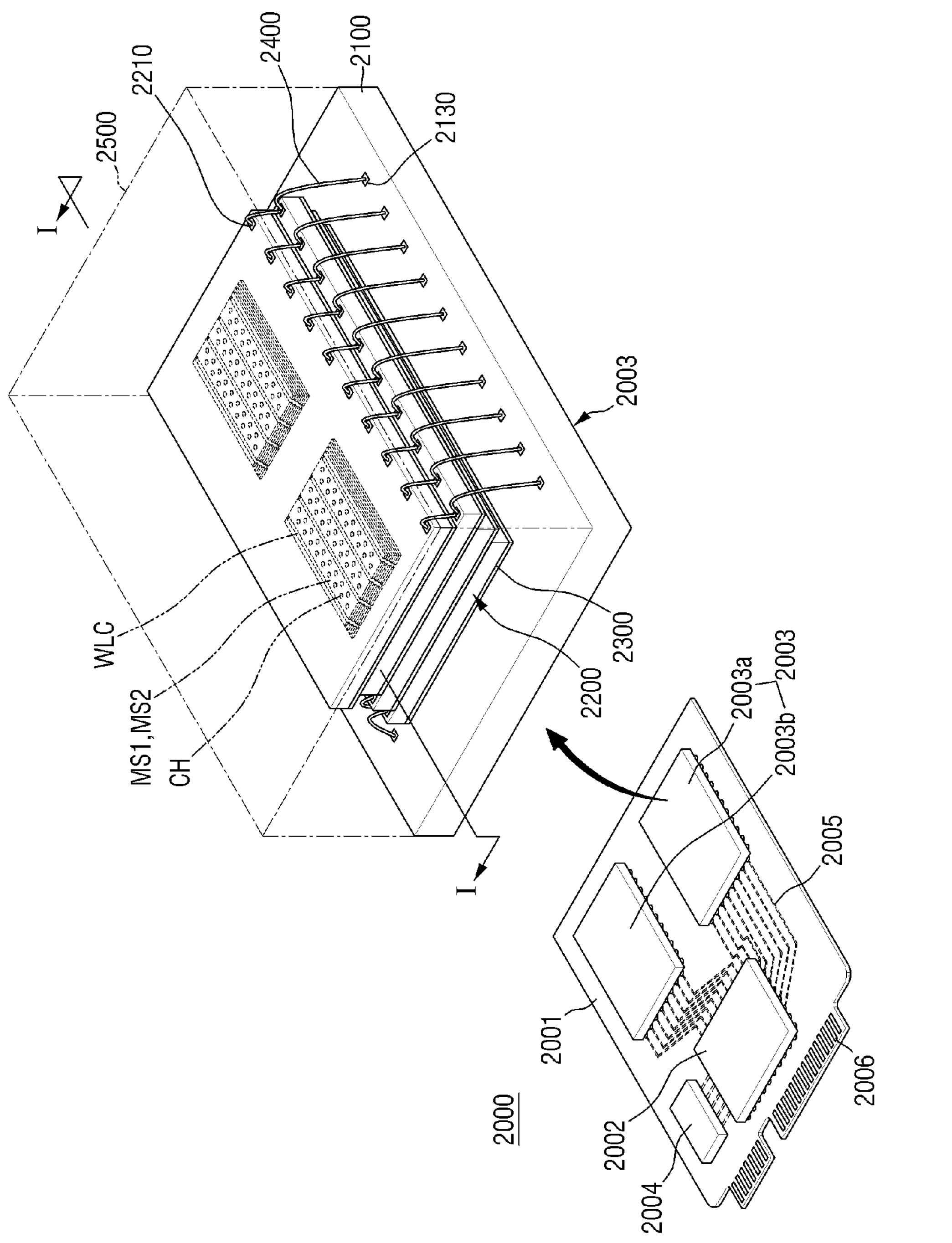
FIG. 29 is a perspective view illustrating an electronic system according to some embodiments of the present invention.
Figure 30:
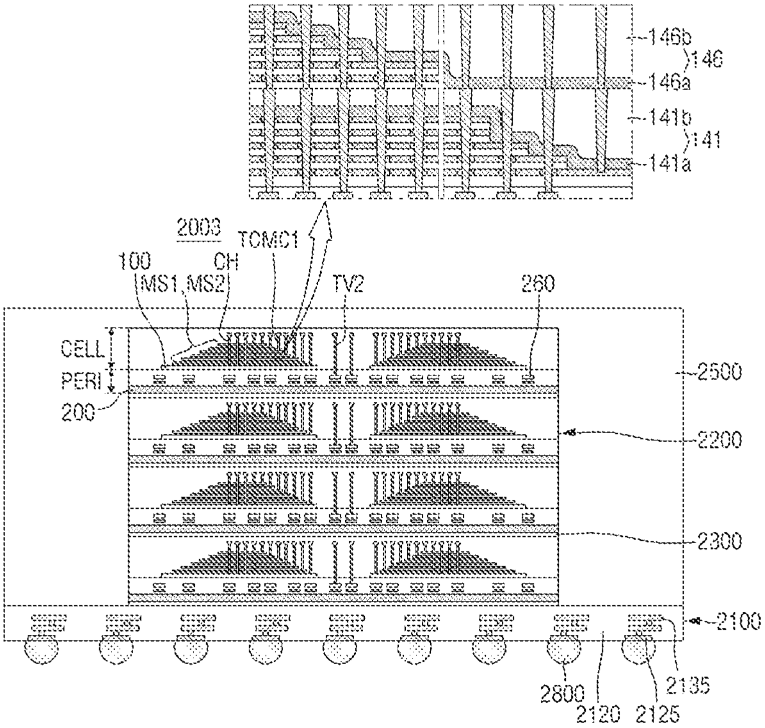
FIG. 30 is a schematic cross-sectional view taken along line I-I of FIG. 29.

Referring to FIGS. 28 to 30, an electronic system according to some embodiments of the present invention may include a main board 2001, and a main controller 2002, one or more semiconductor packages 2003, and a dynamic random access memory (DRAM) 2004 that are mounted on the main board 2001. The semiconductor package 2003 and the DRAM 2004 may be connected to the main controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between an electronic system 2000 and the external host. In some embodiments, the electronic system 2000 may communicate with the external host according to any one of interfaces such as universal serial bus (USB), peripheral component interconnect express (PCI-Express), serial advanced technology attachment (SATA), and M-Phy for universal flash storage (UFS). In some embodiments, the electronic system 2000 may operate by power supplied from the external host through the connector 2006. The electronic system 2000 may further include a power management integrated circuit (PMIC) for distributing the power supplied from the external host to the main controller 2002 and the semiconductor package 2003.

The main controller 2002 may write data to or read data from the semiconductor package 2003, and may improve an operation speed of the electronic system 2000.

The DRAM 2004 may be a buffer memory for alleviating a speed difference between the semiconductor package 2003, which is a data storage space, and the external host. The DRAM 2004 included in the electronic system 2000 may operate as a kind of cache memory, and may also provide a space for temporarily storing data in a control operation for the semiconductor package 2003. When the electronic system 2000 includes the DRAM 2004, the main controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of each of the semiconductor chips 2200, connection structures 2400 electrically connecting the semiconductor chips 2200 to the package substrate 2100, and a molding layer 2500 covering the semiconductor chips 2200 and the connection structures 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 28.

In some embodiments, the connection structure 2400 may be a bonding wire electrically connecting the input/output pad 2210 to the package upper pads 2130. Accordingly, in each of the first and second semiconductor packages 2003*a* and 2003*b*, the semiconductor chips 2200 may be electrically connected to each other by a bonding wire method, and be electrically connected to the package upper pads 2130 of the package substrate 2100. In some embodiments, in each of the first and second semiconductor packages 2003*a* and 2003*b*, the semiconductor chips 2200 may also be electrically connected to each other by connection structures including through silicon vias (TSVs) instead of the bonding wire-type connection structures 2400.

In some embodiments, the main controller 2002 and the semiconductor chips 2200 may also be included in one package. In some embodiments, the main controller 2002 and the semiconductor chips 2200 may be mounted on a separate interposer substrate different from the main board 2001, and the main controller 2002 and the semiconductor chips 2200 may also be connected to each other by wirings formed on the interposer substrate.

In some embodiments, the package substrate 2100 may be a printed circuit board. The package substrate 2100 may include a package substrate body part 2120, package upper pads 2130 disposed on an upper surface of the package substrate body part 2120, lower pads 2125 disposed on or exposed through a lower surface of the package substrate body part 2120, and internal wirings 2135 electrically connecting the package upper pads 2130 and the lower pads 2125 to each other in the package substrate body part 2120. The package upper pads 2130 may be electrically connected to the connection structures 2400. The lower pads 2125 may be connected to the wiring patterns 2005 of the main board 2001 of the electronic system 2000 as illustrated in FIG. 29 through conductive connectors 2800.

Referring to FIGS. 29 and 30, in the electronic system according to some embodiments of the present invention, each of the semiconductor chips 2200 may include the semiconductor memory device described above with reference to FIGS. 1 to 13. For example, each of the semiconductor chips 2200 may include a peripheral circuit region PERI and a memory cell region CELL stacked on the peripheral circuit region PERI. For example, the peripheral circuit region PERI may include the peripheral circuit board 200 and the second wiring structure 260 described above with reference to FIG. 4. In addition, for example, the memory cell region CELL may include the cell substrate 100, the first and second mold structures MS1 and MS2, the channel structure CH, the word line cut region WLC, the bit line BL, and the cell contact structure described above with reference to FIG. 4. In addition, the memory cell region CELL may include the first and second interlayer insulating layers 141*a* and 141*b* having different impurity doping concentrations, and may include the first and second interlayer insulating layers 146*a* and 146*b* having different impurity doping concentrations.

Some embodiments of the present invention have been described hereinabove with reference to the accompanying drawings, but the present invention is not limited to the above-described embodiments, and may be implemented in various different forms, and one of ordinary skill in the art to which the present invention pertains will understand that the present invention may be implemented in other specific forms. Therefore, it is to be understood that the embodiments described above are illustrative rather than being restrictive in all aspects.

What is claimed is:

1. A semiconductor memory device comprising:

a cell substrate including a cell array region, a first extension region, a second extension region, and a through region;

a first mold structure including a plurality of first gate electrodes sequentially stacked on the cell substrate and stacked on the second extension region in a stepwise manner;

a first interlayer insulating layer comprising a first material with a first impurity concentration extending conformally on the first gate electrodes on the second extension region and on the through region;

a second interlayer insulating layer comprising the first material with a second impurity concentration on the first interlayer insulating layer;

a second mold structure including a plurality of second gate electrodes sequentially stacked on the second interlayer insulating layer and stacked on the first extension region in the stepwise manner;

a third interlayer insulating layer on the second gate electrodes;

a fourth interlayer insulating layer comprising the first material with a fourth impurity concentration on the third interlayer insulating layer;

a channel structure in the first mold structure and the second mold structure on the cell array region;

a first cell contact structure in the first interlayer insulating layer and in the first mold structure on the second extension region; and a second cell contact structure in the first interlayer insulating layer, the first mold structure, the second mold structure, and the third interlayer insulating layer on the first extension region, wherein the first impurity concentration of the first interlayer insulating layer is different from the second impurity concentration of the second interlayer insulating layer, the third interlayer insulating layer comprises the first material with a third impurity concentration and extends conformally on the second gate electrodes on the first extension region, on the second extension region, and on the through region, and the third impurity concentration of the third interlayer insulating layer is different from the fourth impurity concentration of the fourth interlayer insulating layer.

2. The semiconductor memory device of claim 1, wherein the second impurity concentration of the second interlayer insulating layer is equal to the third impurity concentration of the third interlayer insulating layer.

3. The semiconductor memory device of claim 1, wherein the first impurity concentration of the first interlayer insulating layer is greater than the second impurity concentration of the second interlayer insulating layer.

4. The semiconductor memory device of claim 1, wherein the first interlayer insulating layer is on the through region, the second interlayer insulating layer is on the first interlayer insulating layer on the through region, and the third interlayer insulating layer is on the second interlayer insulating layer on the through region.

5. The semiconductor memory device of claim 4, further comprising a through via in the first, second and third interlayer insulating layers and the cell substrate on the through region, wherein a length of the through via is greater than a length of the channel structure.

6. The semiconductor memory device of claim 1, further comprising a fifth interlayer insulating layer comprising the first material with a fifth impurity concentration between the first interlayer insulating layer and the second interlayer insulating layer, wherein the fifth impurity concentration of the fifth interlayer insulating layer is different from each of the first and second impurity concentrations of the first and second interlayer insulating layers, respectively.

7. The semiconductor memory device of claim 1, further comprising a fifth interlayer insulating layer comprising the first material with a fifth impurity concentration on the third interlayer insulating layer, and the fifth impurity concentration of the fifth interlayer insulating layer is different from each of the third and fourth impurity concentrations of the third and fourth interlayer insulating layers, respectively.

8. The semiconductor memory device of claim 6, wherein the first interlayer insulating layer is on the first extension region, the second interlayer insulating layer is on the cell array region, the first and second extension regions, and the through region, and the fifth interlayer insulating layer is on the first extension region and the second extension region.

9. The semiconductor memory device of claim 8, wherein an interface between the first interlayer insulating layer and the fifth interlayer insulating layer is parallel to a top surface of the cell substrate, and an interface between the second interlayer insulating layer and the fifth interlayer insulating layer is parallel to the top surface of the cell substrate.

10. The semiconductor memory device of claim 1, wherein the cell substrate comprises the first material with an impurity concentration greater than each of the first and second impurity concentrations of the first interlayer insulating layer and the second interlayer insulating layer, respectively.

11. The semiconductor memory device of claim 1, wherein the cell substrate includes a first surface facing the first mold structure and a second surface opposite the first surface, and the semiconductor memory device further comprises:

a peripheral circuit region on the second surface of the cell substrate and including a wiring structure; and a common source line contact in the first mold structure on the second extension region, wherein the first cell contact structure and the second cell contact structure contact the wiring structure, and the channel structure and the common source line contact do not contact the wiring structure.

12. The semiconductor memory device of claim 1, wherein each of the channel structure, the first cell contact structure, and the second cell contact structure are in each of the first to third interlayer insulating layers.

13. The semiconductor memory device of claim 1, wherein the cell array region, the first extension region, the second extension region, and the through region are sequentially arranged.

14. The semiconductor memory device of claim 1, wherein lengths of the first and second cell contact structures are each longer than a length of the channel structure, and widths of the first and second cell contact structures are each wider than a width of the channel structure.

15. A semiconductor memory device comprising:

a cell substrate including a cell array region, a first extension region, a second extension region, a third extension region, and a through region;

a first mold structure including a plurality of first gate electrodes sequentially stacked on the cell substrate and stacked on the third extension region in a stepwise manner;

a first interlayer insulating layer comprising a first material with a first impurity concentration extending conformally on the first gate electrodes on the third extension region;

a second mold structure including a plurality of second gate electrodes sequentially stacked on the first interlayer insulating layer and stacked on the second extension region in the stepwise manner;

a second interlayer insulating layer comprising the first material with a second impurity concentration extending conformally on the second gate electrodes on the second extension region;

a third mold structure including a plurality of third gate electrodes sequentially stacked on the second interlayer insulating layer and stacked on the first extension region in the stepwise manner;

a third interlayer insulating layer comprising the first material with a third impurity concentration extending conformally on the third gate electrodes on the first extension region;

a fourth interlayer insulating layer comprising the first material with a fourth impurity concentration between the first interlayer insulating layer and the second mold structure;

a channel structure in the first to third mold structures on the cell array region;

a first cell contact structure in the first mold structure on the third extension region;

a second cell contact structure in the first mold structure and the second mold structure on the second extension region; and a third cell contact structure in the first to third mold structures on the first extension region, wherein the first impurity concentration of the first interlayer insulating layer is different from each of the second impurity concentration of the second interlayer insulating layer and the third impurity concentration of the third interlayer insulating layer, and the first impurity concentration of the first interlayer insulating layer is different from the fourth impurity concentration of the fourth interlayer insulating layer.

16. The semiconductor memory device of claim 15, further comprising:

a fifth interlayer insulating layer comprising the first material with a fifth impurity concentration between the second interlayer insulating layer and the third mold structure; and a sixth interlayer insulating layer comprising the first material with a sixth impurity concentration on the third interlayer insulating layer, wherein the second impurity concentration of the second interlayer insulating layer is different from the fifth impurity concentration of the fifth interlayer insulating layer, and the third impurity concentration of the third interlayer insulating layer is different from the sixth impurity concentration of the sixth interlayer insulating layer.

17. The semiconductor memory device of claim 15, wherein the first mold structure is absent from the through region, the second mold structure is absent from the third extension region and the through region, and the third mold structure is absent from the second extension region, the third extension region, and the through region.

18. The semiconductor memory device of claim 15, wherein the first interlayer insulating layer is on the through region, the second interlayer insulating layer is on the first interlayer insulating layer on the through region, and the third interlayer insulating layer is on the second interlayer insulating layer on the through region.

* * * * *